(12) United States Patent
Wang et al.

(10) Patent No.: US 11,184,027 B2
(45) Date of Patent: Nov. 23, 2021

(54) ENCODING METHOD AND ENCODER

(71) Applicant: NTT DOCOMO, INC., Tokyo (JP)

(72) Inventors: Runxin Wang, Beijing (CN); Chongning Na, Beijing (CN); Mingyuan Yang, Beijing (CN); Yousuke Sano, Tokyo (JP); Satoshi Nagata, Tokyo (JP)

(73) Assignee: NTT DOCOMO, INC., Tokyo (JP)

( * ) Notice: Subject to any disclaimer, the term of this patent is extended or adjusted under 35 U.S.C. 154(b) by 90 days.

(21) Appl. No.: 16/476,051

(22) PCT Filed: Jan. 5, 2018

(86) PCT No.: PCT/CN2018/071656
§ 371 (c)(1),
(2) Date: Jul. 3, 2019

(87) PCT Pub. No.: WO2018/127156
PCT Pub. Date: Jul. 12, 2018

(65) Prior Publication Data
US 2019/0334552 A1    Oct. 31, 2019

(30) Foreign Application Priority Data

Jan. 6, 2017 (CN) .......................... 201710011206.8
Aug. 3, 2017 (CN) .......................... 201710656896.2

(51) Int. Cl.
*H03M 13/13* (2006.01)
*H03M 13/00* (2006.01)
*H04L 1/00* (2006.01)

(52) U.S. Cl.
CPC .......... *H03M 13/13* (2013.01); *H03M 13/635* (2013.01); *H04L 1/0013* (2013.01); *H04L 1/0057* (2013.01)

(58) Field of Classification Search
CPC ... H03M 13/13; H03M 13/635; H04L 1/0013; H04L 1/0057; H04L 1/0043; H04L 1/0009; H04L 1/0041
USPC .......................................................... 714/748
See application file for complete search history.

(56) References Cited

U.S. PATENT DOCUMENTS

2019/0140663 A1* 5/2019 Noh .................. H04L 1/007
2020/0177206 A1* 6/2020 Chen ................. H03M 13/2707

* cited by examiner

*Primary Examiner* — James C Kerveros
(74) *Attorney, Agent, or Firm* — Osha Bergman Watanabe & Burton LLP

(57) ABSTRACT

Disclosed are a method and an encoder for performing polar coding on an input data sequence to generate a polar code. The encoding method including: generating, based on a first order index set, a second order index set for parent code length of the polar code, each order index of the first or second order index set representing a priority order of transmitting an information bit in a bit position indicated by the order index relative to transmitting information bits at bit positions indicated by other indexes; spreading, according to the second order index set, the input data sequence to a data sequence with bit number equal to the parent code length; performing polar coding on the spread data sequence to generate the polar code.

6 Claims, 47 Drawing Sheets

Order index set 1
0  1  2  4  8  16 32 3  5  6  9  10 17 12 18 33 20 34 24 7  36
   40 11 13 19 48 14 21 35 22 25 37 26 38 41 28 42 15 49 44 50
   23 52 27 56 39 29 30 43 45 51 46 53 54 57 58 31 60 47 55 59
   61 62 63

Order index set 2
0  1  2  4  8  16 32 3  5  6  9  10 17 12 18 33 20 34 24 7  36
   40 11 13 19 14 48 21 35 22 25 37 26 38 41 28 42 15 49 44 50
   23 52 27 39 56 29 43 30 45 51 46 53 54 57 58 31 60 47 55 59
   61 62 63

Order index set 3
0  1  2  4  8  16 3  32 5  6  9  10 17 12 18 33 20 34 24 7  36
   40 11 13 19 14 48 21 35 22 25 37 26 38 41 28 42 15 49 44 50
   23 52 27 39 56 29 43 30 45 51 46 53 54 57 58 31 60 47 55 59
   61 62 63

Order index set 4
0  1  2  4  8  16 32 3  5  6  9  10 17 12 18 33 20 34 24 7  36 11
   40 13 19 48 14 21 35 22 25 37 26 38 41 28 42 15 49 44 50 23
   52 27 56 39 29 30 43 45 51 46 53 54 57 58 31 60 47 55 59 61
   62 63

Order index set 5
0  1  2  4  8  16 32 3  5  6  9  10 17 12 18 33 20 34 24 7  36 11
   40 13 19 14 48 21 35 22 25 37 26 38 41 28 42 15 49 44 50 23
   52 27 39 56 29 43 30 45 51 46 53 54 57 58 31 60 47 55 59 61
   62 63

Order index set 6
0  1  2  4  8  16 3  32 5  6  9  10 17 12 18 33 20 34 24 7  36 11
   40 13 19 14 48 21 35 22 25 37 26 38 41 28 42 15 49 44 50 23
   52 27 39 56 29 43 30 45 51 46 53 54 57 58 31 60 47 55 59 61
   62 63

FIG. 2(5)

Order index set 7
63 62 61 59 55 47 60 31 58 57 54 53 46 51 45 43 30 29 39 56 27
   52 23 50 44 49 15 42 28 41 38 26 37 25 22 35 21 14 48 19 13 11
   40 36 7 24 34 20 33 18 12 17 10 9 6 5 3 32 16 8 4 2 1
   0

Order index set 8
63 62 61 59 55 47 60 31 58 57 54 53 46 51 45 30 43 29 56 39 27
   52 23 50 44 49 15 42 28 41 38 26 37 25 22 35 21 48 14 19 13 11
   40 36 7 24 34 20 33 18 12 17 10 9 6 5 3 32 16 8 4 2 1
   0

Order index set 9
63 62 61 59 55 47 60 31 58 57 54 53 46 51 45 30 43 29 56 39 27
   52 23 50 44 49 15 42 28 41 38 26 37 25 22 35 21 48 14 19 13 11
   40 36 7 24 34 20 33 18 12 17 10 9 6 5 32 3 16 8 4 2 1
   0

Order index set 10
63 62 61 59 55 47 60 31 58 57 54 53 46 51 45 43 30 29 39 56 27
   52 23 50 44 49 15 42 28 41 38 26 37 25 22 35 21 14 48 19 13
   40 11 36 7 24 34 20 33 18 12 17 10 9 6 5 3 32 16 8 4 2
   1 0

Order index set 11
63 62 61 59 55 47 60 31 58 57 54 53 46 51 45 30 43 29 56 39 27
   52 23 50 44 49 15 42 28 41 38 26 37 25 22 35 21 48 14 19 13
   40 11 36 7 24 34 20 33 18 12 17 10 9 6 5 3 32 16 8 4 2
   1 0

Order index set 12
63 62 61 59 55 47 60 31 58 57 54 53 46 51 45 30 43 29 56 39 27
   52 23 50 44 49 15 42 28 41 38 26 37 25 22 35 21 48 14 19 13
   40 11 36 7 24 34 20 33 18 12 17 10 9 6 5 32 3 16 8 4 2
   1 0

FIG. 2(6)

Order index set 1

| 0 | 1 | 2 | 4 | 8 | 16 | 32 | 3 | 5 | 6 | 9 | 64 | 10 | 17 | 12 | 18 | 33 | 20 | 34 | 24 | 7 |
| | 36 | 65 | 40 | 66 | 11 | 13 | 19 | 68 | 48 | 14 | 72 | 21 | 35 | 80 | 22 | 25 | 37 | 26 | 38 | 67 |
| | 41 | 96 | 28 | 69 | 42 | 15 | 49 | 70 | 44 | 73 | 50 | 23 | 74 | 52 | 81 | 76 | 27 | 56 | 82 | 39 |
| | 97 | 29 | 84 | 30 | 43 | 98 | 71 | 45 | 88 | 51 | 100 | 46 | 75 | 53 | 104 | 77 | 54 | 83 | 57 | 78 |
| | 112 | 85 | 58 | 99 | 31 | 86 | 60 | 89 | 101 | 47 | 90 | 102 | 105 | 92 | 55 | 106 | 79 | 113 | 59 | 108 |
| | 114 | 87 | 61 | 116 | 62 | 91 | 103 | 120 | 93 | 107 | 94 | 109 | 115 | 110 | 117 | 63 | 118 | 121 | 122 | 95 |
| | 124 | 111 | 119 | 123 | 125 | 126 | 127 |

Order index set 2

| 0 | 1 | 2 | 4 | 8 | 16 | 3 | 32 | 5 | 6 | 9 | 64 | 10 | 17 | 12 | 18 | 33 | 20 | 34 | 24 | 7 |
| | 36 | 65 | 40 | 66 | 11 | 13 | 19 | 68 | 48 | 14 | 72 | 21 | 35 | 80 | 22 | 25 | 37 | 26 | 38 | 67 |
| | 41 | 96 | 28 | 69 | 42 | 15 | 49 | 70 | 44 | 73 | 50 | 23 | 74 | 52 | 81 | 76 | 27 | 56 | 82 | 39 |
| | 97 | 29 | 84 | 30 | 43 | 98 | 71 | 45 | 88 | 51 | 100 | 46 | 75 | 53 | 104 | 77 | 54 | 83 | 57 | 78 |
| | 112 | 85 | 58 | 99 | 31 | 86 | 60 | 89 | 101 | 47 | 90 | 102 | 105 | 92 | 55 | 106 | 79 | 113 | 59 | 108 |
| | 114 | 87 | 61 | 116 | 62 | 91 | 103 | 120 | 93 | 107 | 94 | 109 | 115 | 110 | 117 | 63 | 118 | 121 | 122 | 95 |
| | 124 | 111 | 119 | 123 | 125 | 126 | 127 |

Order index set 3

| 0 | 1 | 2 | 4 | 8 | 16 | 32 | 3 | 5 | 6 | 9 | 64 | 10 | 17 | 12 | 18 | 33 | 20 | 34 | 24 | 7 |
| | 36 | 65 | 40 | 66 | 11 | 13 | 19 | 68 | 48 | 14 | 72 | 21 | 35 | 80 | 22 | 25 | 37 | 26 | 38 | 67 |
| | 96 | 41 | 28 | 69 | 42 | 15 | 49 | 70 | 44 | 73 | 50 | 23 | 74 | 52 | 81 | 76 | 27 | 56 | 82 | 39 |
| | 97 | 29 | 84 | 30 | 43 | 98 | 71 | 45 | 88 | 51 | 100 | 46 | 75 | 53 | 104 | 77 | 54 | 83 | 57 | 78 |
| | 112 | 85 | 58 | 99 | 31 | 86 | 60 | 89 | 101 | 47 | 90 | 102 | 105 | 92 | 55 | 106 | 79 | 113 | 59 | 108 |
| | 114 | 87 | 61 | 116 | 62 | 91 | 103 | 120 | 93 | 107 | 94 | 109 | 115 | 110 | 117 | 63 | 118 | 121 | 122 | 95 |
| | 124 | 111 | 119 | 123 | 125 | 126 | 127 |

FIG. 2(7)

Order index set 4

```
0   1   2   4   8   16  32  3   5   6   9   64  10  17  12  18  33  20  34  24  7
    36  65  40  66  11  13  19  68  48  14  72  21  35  80  22  25  37  26  38  67
    96  41  28  69  42  15  49  70  44  73  50  23  74  52  81  76  27  56  82  39
    97  29  84  30  43  98  71  45  88  51  100 46  75  53  104 77  54  83  57  78
    112 85  58  31  99  86  60  89  101 47  90  102 105 92  55  106 79  113 59  108
    114 87  61  116 62  91  103 120 93  107 94  109 115 110 117 63  118 121 122 95
    124 111 119 123 125 126 127
```

Order index set 5

```
0   1   2   4   8   16  32  3   5   6   9   64  10  17  12  18  33  20  34  24  7
    36  65  40  66  11  13  19  68  48  14  72  21  35  80  22  25  37  26  38  67
    96  41  28  69  42  15  49  70  44  73  50  23  74  52  81  76  27  56  82  97
    39  29  84  30  43  98  71  45  88  51  100 46  75  53  104 77  54  83  57  78
    112 85  58  99  31  86  60  89  101 47  90  102 105 92  55  106 79  113 59  108
    114 87  61  116 62  91  103 120 93  107 94  109 115 110 117 63  118 121 122 95
    124 111 119 123 125 126 127
```

Order index set 6

Order index set 7

```
0    1   2   4   8   16  32  3   5   64  9   6   10  17  12  18  33  20  34  24  7
     36  65  66  40  11  13  19  68  48  14  72  21  35  80  25  37  22  26  38  67
     41  96  28  69  42  15  49  70  44  73  50  23  74  52  81  76  27  82  56  39
     97  29  84  43  30  98  71  45  88  51  100 46  75  53  104 77  54  83  57  112
     78  85  58  99  31  60  86  89  101 47  90  102 105 92  55  106 79  113 59  108
     114 87  61  116 62  91  103 120 93  107 94  109 115 110 117 63  118 121 122 95
     124 111 119 123 125 126 127
```

Order index set 8

```
0    1   2   4   8   16  32  3   5   64  9   6   10  17  12  18  33  20  34  24  7
     36  65  66  40  11  13  19  68  48  14  72  21  35  80  25  37  22  26  38  67
     96  41  28  69  42  15  49  70  44  73  50  23  74  52  81  76  27  82  56  39
     97  29  84  43  30  98  71  45  88  51  100 46  75  53  104 77  54  83  57  112
     78  85  58  99  31  60  86  89  101 47  90  102 105 92  55  106 79  113 59  108
     114 87  61  116 62  91  103 120 93  107 94  109 115 110 117 63  118 121 122 95
     124 111 119 123 125 126 127
```

Order index set 9

Order index set 10

| 0 | 1 | 2 | 4 | 8 | 16 | 32 | 3 | 5 | 64 | 9 | 6 | 10 | 17 | 12 | 18 | 33 | 20 | 34 | 24 | 7 |
|---|---|---|---|---|---|---|---|---|---|---|---|---|---|---|---|---|---|---|---|---|
|  | 36 | 65 | 66 | 40 | 11 | 13 | 19 | 68 | 48 | 14 | 72 | 21 | 35 | 80 | 25 | 37 | 22 | 26 | 38 | 67 |
|  | 41 | 96 | 28 | 69 | 42 | 15 | 49 | 70 | 44 | 73 | 50 | 23 | 74 | 52 | 81 | 76 | 27 | 82 | 56 | 97 |
|  | 39 | 29 | 84 | 43 | 30 | 98 | 71 | 45 | 88 | 51 | 100 | 46 | 75 | 53 | 104 | 77 | 54 | 83 | 57 | 112 |
|  | 78 | 85 | 58 | 99 | 31 | 60 | 86 | 89 | 101 | 47 | 90 | 102 | 105 | 92 | 55 | 106 | 79 | 113 | 59 | 108 |
|  | 114 | 87 | 61 | 116 | 62 | 91 | 103 | 120 | 93 | 107 | 94 | 109 | 115 | 110 | 117 | 63 | 118 | 121 | 122 | 95 |
|  | 124 | 111 | 119 | 123 | 125 | 126 | 127 |

Order index set 11

127 126 125 123 119 111 124 95 122 121 118 63 117 110 115 109 94 107 93 120 103
 91 62 116 61 87 114 108 59 113 79 106 55 92 105 102 90 47 101 89 60
 86 31 99 58 85 112 78 57 83 54 77 104 53 75 46 100 51 88 45 71
 98 43 30 84 29 97 39 82 56 27 76 81 52 74 23 50 73 44 70 49
 15 42 69 28 96 41 67 38 26 37 25 22 80 35 21 72 14 48 68 19
 13 11 66 40 65 36 7 24 34 20 33 18 12 17 10 64 9 6 5 3
 32 16 8 4 2 1 0

Order index set 12

Order index set 13

| 127 | 126 | 125 | 123 | 119 | 111 | 124 | 95 | 122 | 121 | 118 | 63 | 117 | 110 | 115 | 109 | 94 | 107 | 93 | 120 | 103 |
|-----|-----|-----|-----|-----|-----|-----|----|-----|-----|-----|----|-----|-----|-----|-----|----|-----|----|-----|-----|
|  | 91 | 62 | 116 | 61 | 87 | 114 | 108 | 59 | 113 | 79 | 106 | 55 | 92 | 105 | 102 | 90 | 47 | 101 | 89 | 60 |
|  | 86 | 31 | 99 | 58 | 85 | 112 | 78 | 57 | 83 | 54 | 77 | 104 | 53 | 75 | 46 | 100 | 51 | 88 | 45 | 71 |
|  | 98 | 43 | 30 | 84 | 29 | 97 | 39 | 82 | 56 | 27 | 76 | 81 | 52 | 74 | 23 | 50 | 73 | 44 | 70 | 49 |
|  | 15 | 42 | 69 | 28 | 41 | 96 | 67 | 38 | 26 | 37 | 25 | 22 | 80 | 35 | 21 | 72 | 14 | 48 | 68 | 19 |
|  | 13 | 11 | 66 | 40 | 65 | 36 | 7 | 24 | 34 | 20 | 33 | 18 | 12 | 17 | 10 | 64 | 9 | 6 | 5 | 3 |
|  | 32 | 16 | 8 | 4 | 2 | 1 | 0 |  |  |  |  |  |  |  |  |  |  |  |  |  |

Order index set 14

| 127 | 126 | 125 | 123 | 119 | 111 | 124 | 95 | 122 | 121 | 118 | 63 | 117 | 110 | 115 | 109 | 94 | 107 | 93 | 120 | 103 |
|-----|-----|-----|-----|-----|-----|-----|----|-----|-----|-----|----|-----|-----|-----|-----|----|-----|----|-----|-----|
|  | 91 | 62 | 116 | 61 | 87 | 114 | 108 | 59 | 113 | 79 | 106 | 55 | 92 | 105 | 102 | 90 | 47 | 101 | 89 | 60 |
|  | 86 | 99 | 31 | 58 | 85 | 112 | 78 | 57 | 83 | 54 | 77 | 104 | 53 | 75 | 46 | 100 | 51 | 88 | 45 | 71 |
|  | 98 | 43 | 30 | 84 | 29 | 97 | 39 | 82 | 56 | 27 | 76 | 81 | 52 | 74 | 23 | 50 | 73 | 44 | 70 | 49 |
|  | 15 | 42 | 69 | 28 | 41 | 96 | 67 | 38 | 26 | 37 | 25 | 22 | 80 | 35 | 21 | 72 | 14 | 48 | 68 | 19 |
|  | 13 | 11 | 66 | 40 | 65 | 36 | 7 | 24 | 34 | 20 | 33 | 18 | 12 | 17 | 10 | 64 | 9 | 6 | 5 | 3 |
|  | 32 | 16 | 8 | 4 | 2 | 1 | 0 |  |  |  |  |  |  |  |  |  |  |  |  |  |

Order index set 15

| 127 | 126 | 125 | 123 | 119 | 111 | 124 | 95 | 122 | 121 | 118 | 63 | 117 | 110 | 115 | 109 | 94 | 107 | 93 | 120 | 103 |
|-----|-----|-----|-----|-----|-----|-----|----|-----|-----|-----|----|-----|-----|-----|-----|----|-----|----|-----|-----|
|  | 91 | 62 | 116 | 61 | 87 | 114 | 108 | 59 | 113 | 79 | 106 | 55 | 92 | 105 | 102 | 90 | 47 | 101 | 89 | 60 |
|  | 86 | 31 | 99 | 58 | 85 | 112 | 78 | 57 | 83 | 54 | 77 | 104 | 53 | 75 | 46 | 100 | 51 | 88 | 45 | 71 |
|  | 98 | 43 | 30 | 84 | 29 | 39 | 97 | 82 | 56 | 27 | 76 | 81 | 52 | 74 | 23 | 50 | 73 | 44 | 70 | 49 |
|  | 15 | 42 | 69 | 28 | 41 | 96 | 67 | 38 | 26 | 37 | 25 | 22 | 80 | 35 | 21 | 72 | 14 | 48 | 68 | 19 |
|  | 13 | 11 | 66 | 40 | 65 | 36 | 7 | 24 | 34 | 20 | 33 | 18 | 12 | 17 | 10 | 64 | 9 | 6 | 5 | 3 |
|  | 32 | 16 | 8 | 4 | 2 | 1 | 0 |  |  |  |  |  |  |  |  |  |  |  |  |  |

FIG. 2(11)

Order index set 16

| 127 | 126 | 125 | 123 | 119 | 111 | 124 | 95 | 122 | 121 | 118 | 63 | 117 | 110 | 115 | 109 | 94 | 107 | 93 | 120 | 103 |
|---|---|---|---|---|---|---|---|---|---|---|---|---|---|---|---|---|---|---|---|---|
| | 91 | 62 | 116 | 61 | 87 | 114 | 108 | 59 | 113 | 79 | 106 | 55 | 92 | 105 | 102 | 90 | 47 | 101 | 89 | 86 |
| | 60 | 31 | 99 | 58 | 85 | 78 | 112 | 57 | 83 | 54 | 77 | 104 | 53 | 75 | 46 | 100 | 51 | 88 | 45 | 71 |
| | 98 | 30 | 43 | 84 | 29 | 97 | 39 | 56 | 82 | 27 | 76 | 81 | 52 | 74 | 23 | 50 | 73 | 44 | 70 | 49 |
| | 15 | 42 | 69 | 28 | 96 | 41 | 67 | 38 | 26 | 22 | 37 | 25 | 80 | 35 | 21 | 72 | 14 | 48 | 68 | 19 |
| | 13 | 11 | 40 | 66 | 65 | 36 | 7 | 24 | 34 | 20 | 33 | 18 | 12 | 17 | 10 | 6 | 9 | 64 | 5 | 32 | 3 |
| | 16 | 8 | 4 | 2 | 1 | 0 | | | | | | | | | | | | | | |

Order index set 17

127 126 125 123 119 111 124 95 122 121 118 63 117 110 115 109 94 107 93 120 103
 91 62 116 61 87 114 108 59 113 79 106 55 92 105 102 90 47 101 89 86
 60 31 99 58 85 78 112 57 83 54 77 104 53 75 46 100 51 88 45 71
 98 30 43 84 29 97 39 56 82 27 76 81 52 74 23 50 73 44 70 49
 15 42 69 28 96 41 67 38 26 22 37 25 80 35 21 72 14 48 68 19
 13 11 40 66 65 36 7 24 34 20 33 18 12 17 10 6 9 64 5 3
 32 16 8 4 2 1 0

Order index set 18

Order index set 19

| 127 | 126 | 125 | 123 | 119 | 111 | 124 | 95 | 122 | 121 | 118 | 63 | 117 | 110 | 115 | 109 | 94 | 107 | 93 | 120 | 103 |
|---|---|---|---|---|---|---|---|---|---|---|---|---|---|---|---|---|---|---|---|---|
| | 91 | 62 | 116 | 61 | 87 | 114 | 108 | 59 | 113 | 79 | 106 | 55 | 92 | 105 | 102 | 90 | 47 | 101 | 89 | 86 |
| | 60 | 99 | 31 | 58 | 85 | 78 | 112 | 57 | 83 | 54 | 77 | 104 | 53 | 75 | 46 | 100 | 51 | 88 | 45 | 71 |
| | 98 | 30 | 43 | 84 | 29 | 97 | 39 | 56 | 82 | 27 | 76 | 81 | 52 | 74 | 23 | 50 | 73 | 44 | 70 | 49 |
| | 15 | 42 | 69 | 28 | 96 | 41 | 67 | 38 | 26 | 22 | 37 | 25 | 80 | 35 | 21 | 72 | 14 | 48 | 68 | 19 |
| | 13 | 11 | 40 | 66 | 65 | 36 | 7 | 24 | 34 | 20 | 33 | 18 | 12 | 17 | 10 | 6 | 9 | 64 | 5 | 3 |
| | 32 | 16 | 8 | 4 | 2 | 1 | 0 | | | | | | | | | | | | | |

Order index set 20

| 127 | 126 | 125 | 123 | 119 | 111 | 124 | 95 | 122 | 121 | 118 | 63 | 117 | 110 | 115 | 109 | 94 | 107 | 93 | 120 | 103 |
|---|---|---|---|---|---|---|---|---|---|---|---|---|---|---|---|---|---|---|---|---|
| | 91 | 62 | 116 | 61 | 87 | 114 | 108 | 59 | 113 | 79 | 106 | 55 | 92 | 105 | 102 | 90 | 47 | 101 | 89 | 86 |
| | 60 | 31 | 99 | 58 | 85 | 78 | 112 | 57 | 83 | 54 | 77 | 104 | 53 | 75 | 46 | 100 | 51 | 88 | 45 | 71 |
| | 98 | 30 | 43 | 84 | 29 | 39 | 97 | 56 | 82 | 27 | 76 | 81 | 52 | 74 | 23 | 50 | 73 | 44 | 70 | 49 |
| | 15 | 42 | 69 | 28 | 96 | 41 | 67 | 38 | 26 | 22 | 37 | 25 | 80 | 35 | 21 | 72 | 14 | 48 | 68 | 19 |
| | 13 | 11 | 40 | 66 | 65 | 36 | 7 | 24 | 34 | 20 | 33 | 18 | 12 | 17 | 10 | 6 | 9 | 64 | 5 | 3 |
| | 32 | 16 | 8 | 4 | 2 | 1 | 0 | | | | | | | | | | | | | |

FIG. 2(13)

Order index set 1

0, 1, 2, 4, 8, 16, 32, 3, 5, 6, 9, 10, 17, 12, 18, 33, 20, 34, 24, 7, 36, 40, 11, 13, 19, 48, 14, 21, 35, 22, 25, 37, 26, 38, 41, 28, 42, 15, 49, 44, 50, 23, 52, 27, 56, 39, 29, 30, 43, 45, 51, 46, 53, 54, 57, 58, 31, 60, 47, 55, 59, 61, 62, 63

Order index set 2

0, 1, 2, 4, 8, 16, 32, 3, 5, 6, 9, 10, 17, 12, 18, 33, 20, 34, 24, 36, 7, 40, 11, 13, 19, 48, 14, 21, 35, 22, 25, 37, 26, 38, 41, 28, 42, 49, 15, 44, 50, 23, 52, 27, 39, 56, 29, 43, 30, 45, 51, 46, 53, 54, 57, 58, 31, 60, 47, 55, 59, 61, 62, 63

Order index set 3

Order index set 1

0, 1, 2, 4, 8, 16, 32, 3, 5, 64, 6, 9, 10, 17, 12, 18, 33, 20, 34, 24, 65, 7, 36, 66, 40, 11, 68, 13, 19, 72, 48, 14, 21, 35, 22, 80, 25, 37, 26, 38, 67, 96, 41, 28, 69, 42, 15, 70, 49, 44, 73, 50, 23, 74, 52, 81, 27, 76, 56, 82, 39, 29, 97, 84, 30, 43, 98, 71, 45, 88, 51, 100, 46, 75, 53, 104, 77, 54, 83, 57, 78, 112, 58, 85, 86, 31, 99, 89, 101, 60, 90, 102, 47, 105, 92, 106, 55, 79, 113, 59, 108, 114, 87, 61, 116, 62, 91, 103, 120, 93, 107, 94, 109, 115, 110, 117, 63, 118, 121, 122, 95, 124, 111, 119, 123, 125, 126, 127

Order index set 2

0, 1, 2, 4, 8, 16, 32, 3, 5, 6, 64, 9, 10, 17, 12, 18, 33, 20, 34, 65, 24, 36, 7, 40, 11, 66, 13, 19, 68, 48, 14, 21, 72, 35, 22, 25, 37, 80, 26, 38, 67, 41, 96, 28, 69, 42, 49, 15, 70, 44, 73, 50, 23, 74, 52, 81, 76, 27, 39, 82, 56, 97, 29, 84, 43, 30, 98, 71, 45, 88, 51, 100, 46, 75, 53, 104, 77, 54, 83, 57, 112, 78, 85, 58, 86, 31, 60, 99, 89, 101, 90, 102, 105, 47, 92, 106, 55, 113, 79, 108, 59, 114, 87, 61, 116, 62, 91, 103, 120, 93, 107, 94, 109, 115, 110, 117, 63, 118, 121, 122, 95, 124, 111, 119, 123, 125, 126, 127

Order index set 3

Order index set 1

0, 1, 2, 4, 8, 16, 32, 3, 5, 64, 6, 9, 10, 128, 17, 12, 18, 33, 20, 34, 24, 65, 7, 36, 66, 40, 11, 68, 129, 13, 19, 130, 72, 48, 14, 132, 21, 35, 22, 80, 136, 25, 37, 26, 38, 67, 144, 96, 41, 28, 69, 42, 160, 15, 70, 131, 49, 44, 73, 50, 23, 133, 74, 52, 81, 27, 134, 192, 137, 76, 56, 82, 39, 29, 138, 97, 84, 145, 30, 43, 140, 98, 71, 146, 45, 88, 51, 161, 100, 148, 46, 75, 53, 162, 104, 152, 77, 135, 164, 193, 54, 83, 57, 78, 112, 194, 139, 58, 168, 85, 86, 196, 141, 31, 99, 89, 101, 147, 176, 60, 142, 200, 90, 149, 102, 47, 105, 163, 92, 150, 208, 153, 106, 165, 55, 79, 154, 113, 59, 166, 195, 224, 169, 108, 114, 156, 197, 87, 170, 61, 116, 177, 198, 143, 172, 201, 62, 91, 103, 178, 120, 202, 93, 151, 180, 209, 107, 204, 94, 210, 155, 184, 109, 167, 225, 115, 212, 157, 110, 171, 117, 158, 226, 63, 199, 118, 173, 216, 121, 179, 228, 174, 122, 181, 232, 203, 95, 205, 124, 182, 211, 185, 206, 240, 111, 213, 186, 159, 227, 214, 188, 217, 119, 218, 229, 233, 230, 123, 175, 220, 125, 234, 183, 207, 241, 236, 187, 126, 242, 215, 189, 244, 190, 219, 231, 248, 221, 235, 222, 127, 237, 243, 238, 245, 191, 246, 249, 250, 223, 252, 239, 247, 251, 253, 254, 255

Order index set 2

Order index set 3

Order index set 1

Order index set 2

Order index set 3

0, 1, 2, 4, 8, 16, 32, 3, 64, 5, 6, 9, 128, 256, 10, 17, 12, 18, 33, 20, 34, 65, 24, 36, 66, 7, 11, 129, 40, 68, 257, 13, 19, 48, 130, 72, 14, 258, 21, 80, 260, 35, 132, 22, 25, 264, 37, 136, 96, 272, 38, 26, 67, 41, 144, 28, 288, 69, 42, 49, 160, 70, 73, 131, 44, 50, 320, 74, 81, 15, 52, 384, 133, 192, 134, 23, 76, 56, 82, 137, 27, 259, 97, 261, 39, 84, 138, 145, 29, 98, 262, 265, 43, 88, 140, 146, 30, 161, 45, 71, 100, 266, 273, 51, 148, 268, 75, 104, 162, 46, 274, 53, 193, 152, 289, 276, 77, 54, 83, 57, 164, 112, 135, 78, 194, 290, 280, 58, 321, 85, 168, 292, 139, 322, 99, 60, 86, 196, 296, 141, 89, 263, 385, 324, 147, 176, 101, 31, 142, 304, 90, 328, 105, 386, 200, 149, 102, 47, 208, 92, 267, 150, 163, 388, 106, 153, 336, 55, 269, 165, 113, 154, 79, 224, 275, 392, 270, 352, 166, 400, 108, 59, 169, 114, 195, 156, 116, 277, 278, 87, 197, 170, 291, 416, 281, 293, 91, 177, 120, 198, 61, 282, 201, 448, 294, 103, 172, 62, 178, 143, 284, 323, 93, 202, 297, 209, 151, 298, 107, 180, 94, 325, 210, 305, 300, 326, 155, 109, 204, 184, 387, 306, 271, 329, 167, 115, 225, 330, 157, 110, 212, 308, 389, 337, 332, 312, 171, 117, 226, 279, 118, 158, 216, 390, 338, 393, 173, 121, 353, 340, 199, 394, 283, 179, 228, 122, 174, 63, 181, 232, 295, 203, 205, 285, 124, 182, 354, 211, 401, 299, 185, 240, 206, 95, 344, 356, 402, 286, 417, 327, 301, 396, 307, 213, 186, 418, 360, 227, 309, 331, 188, 111, 449, 302, 217, 214, 159, 404, 333, 408, 310, 368, 229, 119, 339, 218, 313, 230, 420, 175, 334, 391, 450, 341, 233, 123, 220, 183, 314, 395, 424, 355, 234, 125, 241, 345, 342, 452, 397, 287, 207, 432, 316, 357, 403, 236, 187, 346, 398, 361, 126, 242, 456, 405, 215, 189, 244, 358, 303, 362, 464, 419, 406, 348, 248, 219, 409, 311, 421, 369, 190, 231, 480, 335, 410, 425, 370, 315, 221, 422, 364, 235, 317, 451, 343, 412, 222, 433, 453, 372, 237, 426, 243, 454, 347, 376, 428, 457, 318, 359, 245, 127, 238, 465, 434, 399, 458, 363, 349, 407, 436, 246, 350, 249, 460, 411, 365, 440, 371, 481, 250, 423, 466, 413, 366, 468, 191, 482, 427, 373, 252, 414, 374, 472, 377, 455, 429, 223, 484, 435, 430, 319, 378, 459, 239, 437, 488, 461, 380, 247, 467, 438, 441, 462, 351, 469, 367, 442, 251, 470, 415, 496, 483, 444, 473, 375, 253, 254, 485, 431, 474, 379, 486, 489, 476, 381, 439, 490, 463, 382, 497, 443, 492, 498, 471, 445, 255, 500, 446, 475, 487, 504, 477, 491, 478, 383, 493, 499, 494, 501, 447, 502, 505, 506, 479, 508, 495, 503, 507, 509, 510, 511

图 2(17) (continued 2)

Order index set 1

Order index set 2

Order index set 3

0, 1, 2, 4, 8, 16, 32, 3, 64, 5, 6, 9, 128, 256, 10, 17, 12, 512, 18, 33, 20, 34, 65, 24, 36, 66, 7, 11, 129, 40, 68, 257, 13, 19, 48, 130, 72, 14, 258, 21, 80, 260, 35, 132, 22, 25, 264, 513, 37, 136, 96, 272, 38, 26, 67, 514, 41, 144, 28, 288, 69, 516, 42, 49, 160, 70, 73, 131, 44, 50, 320, 520, 74, 81, 15, 52, 384, 133, 192, 528, 134, 23, 76, 56, 82, 137, 27, 259, 544, 97, 261, 39, 84, 138, 145, 29, 98, 262, 265, 43, 88, 576, 140, 146, 30, 161, 45, 71, 515, 100, 266, 273, 51, 640, 148, 268, 75, 104, 162, 46, 517, 274, 53, 193, 152, 289, 768, 276, 77, 54, 83, 518, 57, 521, 164, 112, 135, 78, 194, 290, 280, 522, 58, 321, 85, 168, 292, 139, 322, 99, 529, 60, 86, 524, 196, 296, 141, 89, 263, 385, 530, 324, 147, 176, 101, 31, 142, 304, 90, 545, 532, 328, 105, 386, 200, 149, 102, 47, 208, 546, 92, 267, 150, 536, 163, 388, 106, 153, 336, 55, 548, 269, 577, 165, 113, 154, 79, 519, 224, 275, 392, 270, 352, 166, 578, 400, 552, 108, 59, 169, 114, 195, 156, 116, 277, 278, 641, 523, 580, 87, 560, 197, 170, 291, 416, 281, 293, 91, 177, 120, 198, 584, 642, 61, 282, 525, 201, 448, 294, 103, 172, 531, 62, 526, 769, 644, 592, 178, 143, 284, 323, 93, 202, 297, 209, 151, 298, 107, 533, 180, 770, 648, 608, 94, 325, 210, 305, 547, 534, 300, 326, 155, 109, 204, 537, 772, 184, 387, 306, 271, 329, 656, 167, 115, 225, 330, 549, 157, 110, 538, 212, 308, 389, 337, 672, 776, 332, 550, 312, 171, 117, 579, 226, 540, 279, 118, 553, 158, 216, 390, 338, 393, 173, 121, 353, 784, 704, 581, 554, 340, 199, 394, 283, 179, 228, 122, 174, 527, 561, 582, 63, 556, 181, 232, 295, 203, 205, 285, 124, 643, 182, 800, 585, 562, 354, 211, 401, 299, 185, 240, 206, 586, 95, 564, 535, 344, 645, 356, 402, 286, 832, 417, 327, 593, 588, 301, 396, 307, 568, 646, 213, 186, 418, 360, 594, 227, 309, 539, 331, 188, 771, 896, 649, 111, 449, 302, 217, 214, 159, 404, 551, 609, 596, 333, 408, 650, 541, 310, 368, 229, 773, 119, 339, 218, 313, 230, 420, 657, 610, 542, 652, 600, 175, 334, 391, 450, 341, 555, 233, 123, 774, 658, 220, 612, 183, 314, 777, 395, 424, 355, 234, 125, 583, 241, 557, 345, 342, 452, 673, 660, 616, 563, 778, 397, 287, 207, 558, 432, 316, 357, 674, 403, 236, 187, 664, 785, 587, 624, 346, 780, 398, 565, 361, 126, 242, 456, 405, 676, 705, 215, 786, 189, 244, 566, 358, 589, 647, 303, 362, 464, 569, 419, 706, 680, 595, 406, 348, 590, 801, 788, 248, 219, 409, 570, 311, 421, 543, 708, 369, 802, 651, 688, 597, 190, 792, 231, 480, 572, 335, 410, 425, 370, 315, 611, 598, 804, 833, 712, 221, 422, 653, 364, 601, 235, 317, 775, 451, 343, 659, 412, 222, 433, 453, 613, 559, 654, 834, 808, 602, 720, 372, 237, 426, 614, 243, 454, 604, 897, 661, 836, 816, 347, 779, 617, 376, 428, 457, 736, 318, 359, 245, 675, 567, 662, 127, 238, 840, 465, 618, 898, 434, 399, 665, 781, 458, 591, 625, 363, 620, 349, 677, 407, 436, 787, 666, 246, 782, 571, 900, 848, 350, 249, 626, 460, 411, 678, 365, 707, 668, 789, 440, 681, 573, 371, 628, 599, 481, 250, 904, 864, 423, 803, 574, 466, 790, 413, 366, 468, 191, 709, 682, 482, 632, 427, 793, 655, 912, 603, 689, 373, 710, 684, 252, 414, 374, 805, 472, 794, 377, 615, 713, 690, 455, 605, 429, 223, 928, 806, 484, 714, 835, 796, 435, 663, 606, 430, 692, 809, 619, 319, 721, 378, 459, 716, 239, 437, 696, 960, 837, 810, 488, 722, 667, 461, 380, 621, 247, 783, 467, 817, 838, 627, 812, 679, 622, 737, 724, 899, 438, 669, 441, 841, 818, 462, 351, 469, 575, 367, 738, 629, 670, 442, 728, 842, 683, 791, 820, 251, 901, 630, 470, 740, 849, 415, 496, 844, 633, 483, 711, 824, 902, 685, 444, 473, 850, 375, 795, 744, 634, 253, 691, 905, 686, 607, 254, 807, 865, 852, 636, 715, 485, 906, 431, 797, 752, 693, 474, 379, 913, 866, 798, 486, 694, 908, 856, 717, 489, 811, 476, 381, 697, 623, 723, 914, 868, 718, 439, 490, 698, 839, 463, 813, 671, 929, 916, 382, 725, 872, 819, 497, 700, 814, 443, 631, 492, 739, 930, 726, 920, 843, 498, 880, 821, 729, 961, 741, 471, 822, 730, 845, 825, 851, 846, 745, 445, 742, 932, 635, 255, 962, 826, 903, 687, 500, 732, 853, 637, 446, 746, 867, 907, 695, 475, 719, 753, 936, 854, 487, 909, 944, 748, 828, 504, 869, 799, 699, 477, 857, 910, 915, 964, 873, 491, 638, 754, 968, 727, 478, 917, 858, 701, 756, 383, 921, 870, 815, 874, 976, 493, 931, 918, 702, 860, 731, 499, 823, 881, 933, 743, 494, 847, 501, 922, 827, 760, 447, 733, 876, 934, 963, 882, 937, 924, 992, 855, 747, 502, 829, 734, 965, 938, 505, 884, 639, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 503, 952, 762, 925, 735, 878, 993, 980, 939, 885, 926, 831, 764, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023

Order index set 4

Order index set 5

Order index set 1 x, x, x, x, x, x, x, x, x, x, x, x, x, x, x, x, 512, x, x, x, x, x, x, x, x, x, x, x, x, x, x, x, x, x, x, x, x, x, x, x, x, 513, x, x, x, x, x, x, x, 514, x, x, x, x, x, 516, x, x, x, x, x, x, x, x, 520, x, x, x, x, x, x, 528, x, x, x, x, x, x, x, 544, x, x, x, x, x, x, x, x, x, x, 576, x, x, x, x, x, x, 515, x, x, x, x, 640, x, x, x, x, x, x, 517, x, x, x, x, x, 768, x, x, x, x, 518, x, 521, x, x, x, x, x, x, x, 522, x, x, x, x, x, x, x, 529, x, x, 524, x, x, x, x, x, 530, x, x, x, x, x, x, x, 545, 532, x, x, x, x, x, x, x, x, 546, x, x, x, 536, x, x, x, x, x, 548, x, 577, x, x, x, x, 519, x, x, x, x, x, 578, x, 552, x, x, x, x, x, x, x, x, 641, 523, 580, x, 560, x, x, x, x, x, x, x, x, x, x, 584, 642, x, x, 525, x, x, x, x, x, 531, x, 526, 769, 644, 592, x, x, x, x, x, x, x, x, x, x, 533, x, 770, 648, 608, x, x, x, x, 547, 534, x, x, x, x, x, 537, 772, x, x, x, x, x, 656, x, x, x, x, 549, x, x, 538, x, x, x, x, 672, 776, x, 550, x, x, x, 579, x, 540, x, x, 553, x, x, x, x, x, x, x, 784, 704, 581, 554, x, x, x, x, x, x, x, x, 527, 561, 582, x, 556, x, x, x, x, x, x, 643, x, 800, 585, 562, x, x, x, x, x, x, 586, x, 564, 535, x, 645, x, x, x, 832, x, x, 593, 588, x, x, x, 568, 646, x, x, x, x, 594, x, x, 539, x, x, 771, 896, 649, x, x, x, x, x, x, 551, 609, 596, x, x, 650, 541, x, x, x, 773, x, x, x, x, x, 657, 610, 542, 652, 600, x, x, x, x, x, 555, x, x, 774, 658, x, 612, x, x, 777, x, x, x, x, x, 583, x, 557, x, x, x, 673, 660, 616, 563, 778, x, x, x, 558, x, x, x, 674, x, x, x, 664, 785, 587, 624, x, 780, x, 565, x, x, x, x, 676, 705, x, 786, x, x, 566, x, 589, 647, x, x, x, 569, x, 706, 680, 595, x, x, 590, 801, 788, x, x, x, 570, x, x, 543, 708, x, 802, 651, 688, 597, x, 792, x, x, 572, x, x, x, x, 611, 598, 804, 833, 712, x, x, 653, x, 601, x, x, 775, x, x, 659, x, x, x, 613, 559, 654, 834, 808, 602, 720, x, x, x, 614, x, x, 604, 897, 661, 836, 816, x, 779, 617, x, x, x, 736, x, x, x, 675, 567, 662, x, x, 840, x, 618, 898, x, x, 665, 781, x, 591, 625, x, 620, x, 677, x, x, 787, 666, x, 782, 571, 900, 848, x, x, 626, x, x, 678, x, 707, 668, 789, x, 681, 573, x, 628, 599, x, x, 904, 864, x, 803, 574, x, 790, x, x, x, x, 709, 682, x, 632, x, 793, 655, 912, 603, 689, x, 710, 684, x, x, x, 805, x, 794, x, 615, 713, 690, x, 605, x, x, 928, 806, x, 714, 835, 796, x, 663, 606, x, 692, 809, 619, x, 721, x, x, 716, x, x, 696, 960, 837, 810, x, 722, 667, x, x, 621, x, 783, x, 817, 838, 627, 812, 679, 622, 737, 724, 899, x, 669, x, 841, 818, x, x, x, 575, x, 738, 629, 670, x, 728, 842, 683, 791, 820, x, 901, 630, x, 740, 849, x, x, 844, 633, x, 711, 824, 902, 685, x, x, 850, x, 795, 744, 634, x, 691, 905, 686, 607, x, 807, 865, 852, 636, 715, x, 906, x, 797, 752, 693, x, x, 913, 866, 798, x, 694, 908, 856, 717, x, 811, x, x, 697, 623, 723, 914, 868, 718, x, x, 698, 839, x, 813, 671, 929, 916, x, 725, 872, 819, x, 700, 814, x, 631, x, 739, 930, 726, 920, 843, x, 880, 821, 729, 961, 741, x, 822, 730, 845, 825, 851, 846, 745, x, 742, 932, 635, x, 962, 826, 903, 687, x, 732, 853, 637, x, 746, 867, 907, 695, x, 719, 753, 936, 854, x, 909, 944, 748, 828, x, 869, 799, 699, x, 857, 910, 915, 964, 873, x, 638, 754, 968, 727, x, 917, 858, 701, 756, x, 921, 870, 815, 874, 976, x, 931, 918, 702, 860, 731, x, 823, 881, 933, 743, x, 847, x, 922, 827, 760, x, 733, 876, 934,

Order index set 2 x, x, x, x, x, x, x, x, x, x, x, x, x, x, x, x, 512, x, x, x, x, x, x, x, x, x, x, x, x, x, x, x, x, x, x, x, x, x, x, x, x, x, 513, x, x, x, x, x, x, x, 514, x, x, x, x, x, 516, x, x, x, x, x, x, x, x, 520, x, x, x, x, x, x, x, 528, x, x, x, x, x, x, x, x, 544, x, x, x, x, x, x, x, x, x, x, x, 576, x, x, x, x, x, x, 515, x, x, x, x, 640, x, x, x, x, x, x, 517, x, x, x, x, x, 768, x, x, x, x, 518, x, 521, x, x, x, x, x, x, x, 522, x, x, x, x, x, x, x, 529, x, x, 524, x, x, x, x, x, x, 530, x, x, x, x, x, x, x, 545, 532, x, x, x, x, x, x, x, 546, x, x, x, 536, x, x, x, x, x, 548, x, 577, x, x, x, 519, x, x, x, x, x, 578, x, 552, x, x, x, x, x, x, x, 641, 523, 580, x, 560, x, x, x, x, x, x, x, x, x, 584, 642, x, x, 525, x, x, x, x, 531, x, 526, 769, 644, 592, x, x, x, x, x, x, x, x, x, 533, x, 770, 648, 608, x, x, x, 547, 534, x, x, x, x, x, 537, 772, x, x, x, x, x, 656, x, x, x, x, 549, x, x, 538, x, x, x, x, 672, 776, x, 550, x, x, x, 579, x, 540, x, x, 553, x, x, x, x, x, x, x, 784, 704, 581, 554, x, x, x, x, x, x, x, 527, 561, 582, x, 556, x, x, x, x, x, x, 643, x, 800, 585, 562, x, x, x, x, x, x, 586, x, 564, 535, x, 645, x, x, x, 832, x, x, 593, 588, x, x, x, 568, 646, x, x, x, x, 594, x, x, 539, x, x, 771, 896, 649, x, x, x, x, x, x, 551, 609, 596, x, x, 650, 541, x, x, x, 773, x, x, x, x, x, 657, 610, 542, 652, 600, x, x, x, x, x, 555, x, x, 774, 658, x, 612, x, x, 777, x, x, x, x, 583, x, 557, x, x, x, 673, 660, 616, 563, 778, x, x, x, 558, x, x, x, 674, x, x, x, 664, 785, 587, 624, x, 780, x, 565, x, x, x, x, x, 676, 705, x, 786, x, x, 566, x, 589, 647, x, x, x, 569, x, 706, 680, 595, x, x, 590, 801, 788, x, x, x, 570, x, x, 543, 708, x, 802, 651, 688, 597, x, 792, x, x, 572, x, x, x, x, x, 611, 598, 804, 833, 712, x, x, 653, x, 601, x, x, 775, x, x, 659, x, x, x, x, 613, 559, 654, 834, 808, 602, 720, x, x, x, 614, x, x, 604, 897, 661, 836, 816, x, 779, 617, x, x, x, 736, x, x, x, 675, 567, 662, x, x, 840, x, 618, 898, x, x, 665, 781, x, 591, 625, x, 620, x, 677, x, x, 787, 666, x, 782, 571, 900, 848, x, x, 626, x, x, 678, x, 707, 668, 789, x, 681, 573, x, 628, 599, x, x, 904, 864, x, 803, 574, x, 790, x, x, x, x, 709, 682, x, 632, x, 793, 655, 912, 603, 689, x, 710, 684, x, x, x, 805, x, 794, x, 615, 713, 690, x, 605, x, x, 928, 806, x, 714, 835, 796, x, 663, 606, x, 692, 809, 619, x, 721, x, x, 716, x, x, 696, 960, 837, 810, x, 722, 667, x, x, 621, x, 783, x, 817, 838,

ENCODING METHOD AND ENCODER

CROSS-REFERENCE TO RELATED APPLICATIONS

This patent application is a 371 U.S. National Phase of International Application No. PCT/CN2018/071656, filed on Jan. 5, 2018, which claims priority to Chinese Patent Application No. 201710011206.8 filed on Jan. 6, 2017 and Chinese Patent Application No. 201710656896.2 filed on Aug. 3, 2017. The entire disclosures of the above applications are incorporated herein by reference.

The present disclosure relates to channel coding, and particularly, to an encoding method and an encoder for performing polar coding on an input data sequence.

BACKGROUND

In order to ensure signal transmission quality, channel coding on data is required. Typically, a channel code having a code length of M is generated for an input data sequence of a length (bit number) of K, where M>K. Various channel coding methods including polar coding are proposed to realize better performance.

In polar coding, an input data sequence of a length of K needs to be spread to a data sequence of a length of N, then the spread data sequence is subjected to encoding (basic polar coding) to generate a parent polar code having a code length (i.e., parent code length) of N, after which rate matching is performed on the parent polar code to generate a polar code having a code length of M. In order to generate the input data sequence of a length of N (which has N bit positions), bits known to both a transmitting end and a receiving end are inserted in additional N−K bit positions. The bits known to both the transmitting end and the receiving end are referred to as frozen bits, which are, for example, 0. The N−K bit positions should be selected appropriately from all N bit positions to ensure signal transmission quality. A set of these N−K bit positions is referred to as a frozen set.

In an actual communication system, it may be desirable to generate polar codes having different parent code lengths, which are powers of 2, such as 4, 8, 1024 or 2048, etc. Therefore, a frozen set should be determined for each possible parent code length. Conventionally, a frozen set is predetermined for each parent code length and encoding rate of a polar code, and stored in a storage for use in communication, which however, requires a large amount of storage space. It is proposed that, in each communication, a corresponding frozen set is determined instantaneously in accordance with a parent code length of a polar code to be generated to reduce requirement for storage space, which however, increases complexity of operation and leads to relatively large latency.

SUMMARY

According to an embodiment of the present disclosure, a method for performing polar coding on an input data sequence to generate a polar code is provided, the method comprising: generating, based on a first order index set, a second order index set for a parent code length of the polar code, each order index of the first or second order index set representing a priority order of transmitting an information bit in a bit position indicated by the order index relative to transmitting information bits in bit positions indicated by other indexes; spreading, according to the second order index set, the input data sequence to a data sequence with bit number equal to the parent code length; performing polar coding on the spread data sequence to generate the polar code.

According to another embodiment of the present disclosure, an encoder for performing polar coding on an input data sequence to generate a polar code is provided, the encoder comprising: a storing unit configured to store a first order index set, each order index of the first or second order index set representing a priority order of transmitting an information bit in a bit position indicated by the order index relative to transmitting information bits in bit positions indicated by other indexes; a generating unit configured to generate, based on the first order index set, a second order index set for a parent code length of the polar code; a spreading unit configured to spread, according to the second order index set, the input data sequence to a data sequence with bit number equal to the parent code length; an encoding unit configured to perform polar coding on the spread data sequence to generate the polar code.

According to another embodiment of the present disclosure, a method for performing polar coding on an input data sequence to generate a polar code is provided, comprising: acquiring, according to a first order index set, order indexes with values smaller than code length of the polar code, each order index of the first order index set representing a priority order of transmitting an information bit in a bit position indicated by the order index relative to transmitting information bits in bit positions indicated by other indexes; spreading, using the acquired order indexes, the input data sequence to a data sequence with bit number equal to a parent code length of the polar code; performing polar coding on the spread data sequence to generate the polar code According to another embodiment of the present disclosure, an encoder for performing polar coding on an input data sequence to generate a polar code is provided, the encoder comprising: a storing unit configured to store a first order index set, each order index of the first order index set representing a priority order of transmitting an information bit in a bit position indicated by the order index relative to transmitting information bits in bit positions indicated by other indexes; an acquiring unit configured to acquire, according to the first order index set, order indexes with values smaller than code length of the polar code; a spreading unit configured to spread, using the acquired order indexes, the input data sequence to a data sequence with bit number equal to a parent code length of the polar code; an encoding unit configured to perform polar coding on the spread data sequence to generate the polar code.

According to another embodiment of the present disclosure, a method for performing polar coding on an input data sequence to generate a polar code is provided, comprising: spreading, according a first order index set, the input data sequence to a data sequence with bit number equal to a parent code length of the polar code, each order index of the first order index set representing a priority order of transmitting an information bit in a bit position indicated by the order index relative to transmitting information bits in bit positions indicated by other indexes; performing polar coding on the spread data sequence to generate the polar code, and the first order index set may be one of order index sets described in FIGS. 2(1)-2(19).

According to another embodiment of the present disclosure, an encoder for performing polar coding on an input data sequence to generate a polar code is provided, the encoder comprising: a storing unit configured to store a first order index set, each order index of the first order index set representing a priority order of transmitting an information bit in a bit position indicated by the order index relative to transmitting information bits in bit positions indicated by other indexes; a spreading unit configured to spread, using the first order index set, the input data sequence to a data sequence with bit number equal to a parent code length of the polar code; an encoding unit configured to perform polar coding on the spread data sequence to generate the polar code, wherein the first order index set may be one of order index sets described in FIGS. 2(1)-2(19).

BRIEF DESCRIPTION OF THE DRAWINGS

The foregoing and other objects, features and advantages of the present disclosure will become more apparent from the detailed description of embodiments of the present disclosure in conjunction with the accompanying drawings. The drawings are included to provide a further understanding of the embodiments of the present disclosure, constitute a part of this specification, and help to explain the present disclosure together with the embodiments of the present disclosure, but are not intended to act as a limitation of the present disclosure. In the drawings, like reference numerals usually indicate like components or steps.

FIGS. 8B-8E illustrate examples of reversed order index sets obtained by bit-reversal of order index sets for a parent code length of 4096.

DETAILED DESCRIPTION

In order to make the objectives, technical solutions and advantages of the present disclosure more apparent, exemplary embodiments according to the present disclosure will be described in detail below with reference to the drawings. Apparently, the described embodiments are only a part but not all of the embodiments of the present disclosure. It should be understood that the present disclosure is not limited by the exemplary embodiments described herein. All other embodiments obtained by a person skilled in the art based on the embodiments of the present disclosure described herein without creative effort fall within the scope of the present disclosure.

Figure 1:
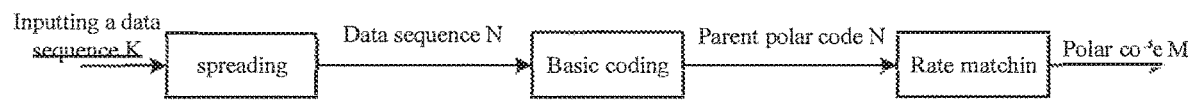
FIG. 1 schematically illustrates the principle of polar coding.

First, the principle of polar coding will be introduced briefly. As shown in FIG. 1, an input data sequence of a length (bit number) of K is spread to an N-bit input data sequence, where K<N. The spread data sequence is then subjected to basic polar coding to generate a parent code of a length of N. Next, rate matching is performed on the parent code of a length of N to generate a polar code of code a length of M ($\leq$ N). N may be referred to as the parent code length of the polar code, and M may be referred to as code length of the polar code. Basic polar coding and rate matching may by performed using methods known in the art, which will not be described repeatedly herein.

As described above, in order to spread the input data sequence of a length (bit number) of K to the N-bit input data sequence, N−K bit positions should be selected appropriately from N bit positions to insert the frozen bits, and K bits (information bits) of the input data sequence are placed in the remaining K bit positions.

In an embodiment of the present disclosure, a set of order indexes (i.e., an order index set) is produced for a predetermined parent code length $N_{pred}$ of all possible parent code lengths of the polar code. The predetermined parent code length $N_{pred}$ may be maximum possible parent code length (or maximum parent code length) of all the possible parent code lengths, or a certain parent code length smaller than the maximum possible parent code length. During communication, if the parent code length N of a polar code to be generated is different from the predetermined parent code length $N_{pred}$, an order index set for the parent code length N of the polar code to be generated may be produced based on the order index set for the predetermined parent code length $N_{pred}$, and the input data sequence is spread based on the generated order index set to generate a data sequence of a length of N, or the input data sequence is spread based on the order index set for the predetermined parent code length directly to generate a data sequence of a length of N.

Figure 2:
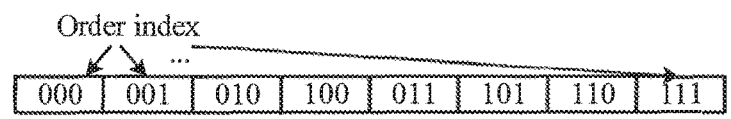
FIGS. 2(1)-2(19) illustrates examples of order index sets according to an embodiment of the present disclosure.

The order index set described above includes order indexes with number equal to the parent code length, each order index representing a priority order of transmitting an information bit in a bit position indicated by the order index relative to transmitting information bits in bit positions indicated by other indexes of the order index set. In particular, a value of each order index indicates one bit position, and a position (or an order) of each order index in the order index set represents a priority order of transmitting information bits in the bit position indicated by the order index relative to transmitting information bits in bit positions indicated by other indexes of the order index set. FIG. 2(1) illustrates an example of an order index set for a parent code length of 8. In the example, there are 8 order indexes with number equal to the parent code length, indicating bit positions 0-7, respectively, where an order index 000 (0) indicates a bit position 0, an order index 001 (1) indicates a bit position 1, and so on. Priority orders corresponding to bit positions indicated by respective order indexes may be determined in a right-to-left order, such that priority orders corresponding to bit positions indicated by order indexes located on the right side of the index set (i.e., priority orders of transmitting information bits in bit positions indicated by order indexes located on the right side) are better than priority orders corresponding to bit positions indicated by order indexes located on the left side of the index set (i.e., priority orders of transmitting information bits in bit positions indicated by order indexes located on the left side). In the example shown in FIG. 2(1), an order index "111" is located on the rightmost side, thus a priority order corresponding to a bit position "7" (i.e., the eighth bit position in bit positions 0-7) indicated by the order index is better than priority orders corresponding to other bit positions 0-6. It should be appreciated that the order index set illustrated in FIG. 2(1) is merely an example, and that an order index set for the predetermined parent code length may have more or fewer order indexes (with the same number as the parent code length). For example, the predetermined parent code length may be 4096, an order index set for the parent code length 4096 may be, for example, as shown in FIGS. 2(2), 2(3) and 2(4). Moreover, for example, the predetermined parent code length may be 64, an order index set for the parent code length 64 may be, for example, one of order index sets 1-6 as shown in FIG. 2(5) or one of order index sets 7-12 as shown in FIG. 2(6). As another example, the predetermined parent code length may be 128, an order index set for the parent code length 128 may be, for example, one of order index sets 1-20 as shown in FIG. 2(7), FIG. 2(8), FIG. 2(9), FIG. 2(10), FIG. 2(11), FIG. 2(12) and FIG. 2(13). Further, in the case where the predetermined parent code length is 64, the order index set for the parent code length 64 may also be, for example, one of three order index sets as shown in FIG. 2(14). Further, in the case where the predetermined parent code length is 128, the order index set for the parent code length 128 may also be, for example, one of three order index sets as shown in FIG. 2(15). Further, the predetermined parent code length may be 256, and an order index set for the parent code length 256 may be one of three order index sets as shown in FIG. 2(16). Further, the predetermined parent code length may be 512, and an order index set for the parent code length 512 may be one of three order index sets as shown in FIG. 2(17). Further, the predetermined parent code length may be 1024, and an order index set for the parent code length 1024 may be one of five order index sets as shown in FIG. 2(18). Further, in the case where the predetermined parent code length is 1024, the order index set for the parent code length 1024 may also be, for example, one of two order index sets as shown in FIG. 2(19). As shown in FIG. 2(19), each of the two order index sets includes 512 "x", and the 512 "x" may represent values different from each other in values 0-511, such that the 512 "x" may form a sequence of a length of 512. The sequence of a length of 512 may be the same as sequences shown in FIG. 2(17), or may be sequences of any other form. In addition, priority order corresponding to order indexes may also be changed, for example, the priority orders may be determined in a left-to-right order, such that priority orders corresponding to bit positions indicated by order indexes located on the left side of the index set are better than priority orders corresponding to bit positions indicated by order indexes located on the right side of the index set. Hereinafter, embodiments of the present disclosure will be described by taking the priority orders determined in a right-to-left order as an example.

Figure 3:
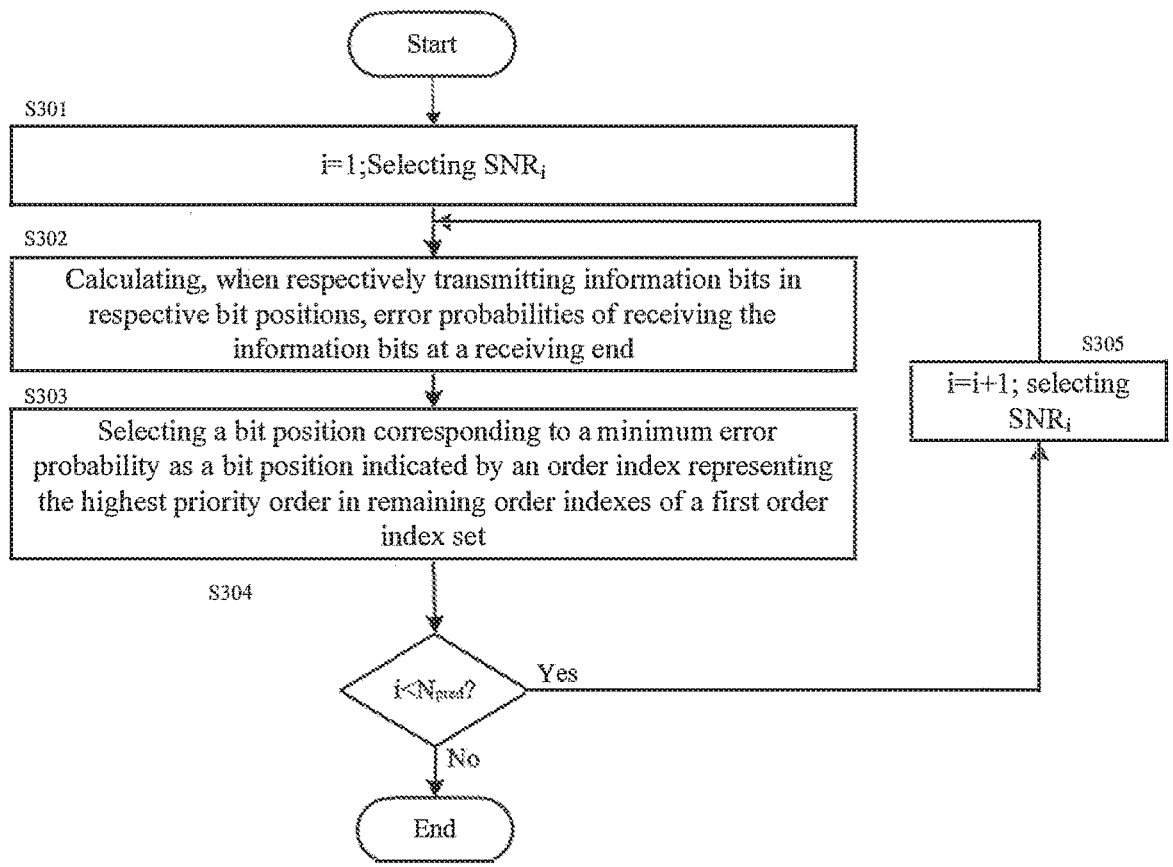
FIG. 3 is a flow chart of a method for determining an order index set for a predetermined parent code length.

The order index set for the predetermined parent code length $N_{pred}$ may be determined using a method shown in FIG. 3. Bit positions indicated by respective order indexes of the order index set may be bit positions selected respectively according to error probabilities, calculated based on different channel conditions, of receiving information bits when transmitting the information bits in respective bit positions. For convenience of description, signal-to-noise ratio (SNR) is used as an example of channel conditions. First, an SNR sequence $\{SNR_1, SNR_2 \ldots, SNR_{Npred}\}$ is initialized, where values of $SNR_1, SNR_2 \ldots, SNR_{Npred}$ may be set according to actual channel conditions and/or requirements between a base station and a user equipment. For example, $SNR_1$ may be set to a measured value of SNR of a channel between the base station and the user equipment at a certain time. Further, settings may be made such that $SNR_1 \leq SNR_2 \leq \ldots \leq SNR_{Npred}$, and $SNR_1, SNR_2 \ldots, SNR_{Npred}$ may also be set as having other relationships. As described above, Npred may be the maximum possible parent code length Nmax, or it may be other parent code lengths.

In step 301, i is initialized as 1, and $SNR_i$ (herein, $SNR_1$) is selected from the SNR sequence. In step 302, error probabilities $e_1, e_2 \ldots, e_{Npred}$ of receiving information bits at a receiving end when transmitting, respectively, the information bits in respective bit positions (sub-channels) of $N_{pred}$ bit positions are calculated according to $SNR_1$. The error probabilities may be calculated according to methods known in the art, such as density evolution or Gaussian approximation, and a detailed description thereof is omitted here. Then, in step S303, a bit position corresponding to a minimum error probability of the error probabilities $e_1, e_2 \ldots, e_{Npred}$ (i.e., a bit position in which error probability is the minimum when transmitting information bits thereon) is selected as a bit position indicated by an order index representing the highest priority order in the remaining order indexes of the order index set for the predetermined parent code length. In the example of FIG. 1, a bit position 7 corresponds to the minimum error probability in the bit positions 0-7, thus the bit position 7 (or its binary representation 111) is set as a bit position indicated by an order index representing the highest priority order (i.e., the rightmost order index) in the remaining order indexes (herein, 8 order indexes). Then, in step S304, it is determined whether i is smaller than $N_{pred}$. If yes, proceed to step S305, in which set i=i+1, and select $SNR_{i+1}$ (herein, $SNR_2$) from the SNR sequence, and calculate, according to $SNR_2$, the error probability $e_1, e_2, \ldots, e_{Npred}$ of receiving information bits at the receiving end when transmitting, respectively the information bits on respective bit positions (sub-channels) of $N_{max}$ bit positions, in step S303. Then, in step S303, a bit position corresponding to the minimum error probability of the error probabilities $e_1, e_2, \ldots, e_{Npred}$ is selected as a bit position indicated by an order index representing the highest priority order in the remaining order indexes of the order index set for the predetermined parent code length. In the example of FIG. 1, a bit position 6 corresponds to the minimum error probability in the bit positions 0-7, thus the bit position 6 (or 110) is set as a bit position indicated by an order index representing the highest priority order (second order index from the right) in the remaining order indexes (herein, 8 order indexes). Then, in step S304, it is determined whether i is smaller than $N_{pred}$. If yes, steps S302-S304 are repeatedly performed in the manner described above. Otherwise, if not, the process ends. It should be noted that, in step S302, if a bit position corresponding to the minimum error probability selected in a certain round of calculation of error probabilities has been previously selected and thus has been included in the order index for the predetermined parent code length, a bit position corresponding to a second minimum error probability may be selected to be included in the order index set for the predetermined parent code length; and if a bit position corresponding to the second minimum error probability has been previously selected and thus has been included in the order index for the predetermined parent code length, a bit position corresponding to a third minimum error probability may be selected to be included in the order index set for the predetermined parent code length, and so forth. Alternatively, in step S302, if a bit position corresponding to the minimum error probability selected in a certain round of calculation of error probabilities has been previously selected and thus has been included in the order index for the predetermined parent code length, selection of a bit position may not be performed for the current round of calculation of error probabilities, instead, the next round of calculation of error probabilities may be performed in which case multiple bit positions may be selected in the next round, or an additional round of calculation of error probabilities may be performed and a bit position corresponding to the minimum error probability is selected, until $N_{pred}$ bit positions are finally selected, thereby determining $N_{pred}$ order indexes of the order index set for the predetermined parent code length.

In this way, the order index set having $N_{pred}$ order indexes for the predetermined parent code length $N_{pred}$ may be generated by the error probabilities calculated for $N_{pred}$ rounds according to $N_{pred}$ SNRs, respectively, and by selecting a bit position corresponding to the minimum error probability after each round of calculation. It should be appreciated that the above method of determining the order index set for the predetermined parent code length is illustrative rather than restrictive. For example, although the SNR sequence having $N_{pred}$ SNRs is set and correspondingly $N_{pred}$ rounds of calculation of error probabilities are performed in the above example, an SNR sequence having L (less than $N_{pred}$) SNRs may be set and correspondingly L rounds of calculation of error probabilities are performed. After each round of calculation of error probabilities, one or more error probabilities may be selected in order of error probabilities form small to large, and then bit positions corresponding to the selected one or more error probabilities are determined as bit positions indicated by corresponding order indexes in the order index set for the predetermined parent code length, thereby determining the order index set having $N_{pred}$ order indexes. Alternatively, after each round of calculation of error probabilities, a first number of error probabilities may be selected in order of error probabilities from small to large, and a second number of error probabilities are selected according to positions of the selected first number of error probabilities, and then the bit positions are determined as bit positions indicated by corresponding order indexes in the order index set for the predetermined parent code length. For example, assuming that a bit position 7 is selected after a certain round of calculation of error probabilities, a bit position adjacent to the bit position (for example, 6) or a bit position separated from the bit position (for example, 5) may be further selected, and the bit position is determined as a bit position indicated by a corresponding order index in the order index set for the predetermined parent code length. It should be appreciated that the first order index set may be generated using other methods, without being limited to the method described above. For example, respective order indexes in the first order index set may be directly designated as needed.

A method for performing polar coding on an input data sequence to generate a polar code according to a first embodiment of the present disclosure will be described below with reference to FIG. 4. The method may be executed by a base station and/or a user equipment in a mobile communication system.

Figure 4:
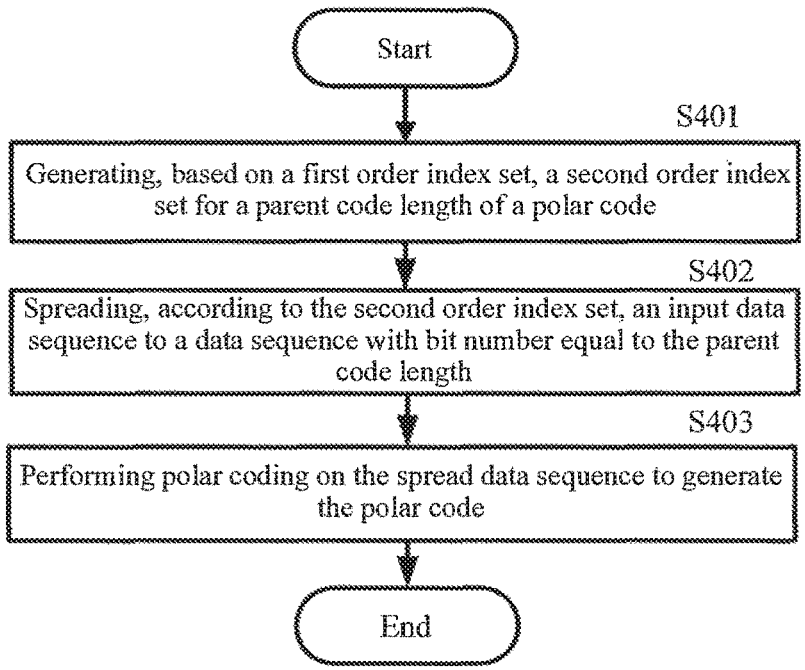
FIG. 4 is a flow chart of a method for performing polar coding on an input data sequence to generate a polar code according to a first embodiment of the present disclosure.

As shown in FIG. 4, in step S401, a second order index set for the parent code length (N) of the polar code is generated based on a first order index set. As described above, each order index of the first or second order index set represents a priority order of transmitting an information bit in a bit position indicated by the order index relative to transmitting information bits in bit positions indicated by other indexes.

In a first implementation, the first order index set is an order index set for a maximum possible parent code length $N_{max}$ of the polar code. As described above, bit positions indicated by respective order indexes of the order index set for the maximum possible parent code length are bit positions selected respectively according to error probabilities, calculated based on different channel conditions, of receiving information bits when transmitting the information bits in respective bit positions. The first order index set may be determined in the manner of determining the order index set for the predetermined parent code length (herein, the predetermined parent code length is the maximum possible parent code length $N_{max}$), as described above, which will not be described repeatedly herein. It should be noted that, the first order index set may be determined and stored before the method described in FIG. 4 is executed, or may be determined and stored as a part of step S401 or before step S401 when executing the method described in FIG. 4.

If the parent code length N of the polar code is equal to the maximum possible parent code length $N_{max}$, the first order index set may be used as the second order index set for the parent code length N of the polar code.

Figure 5:
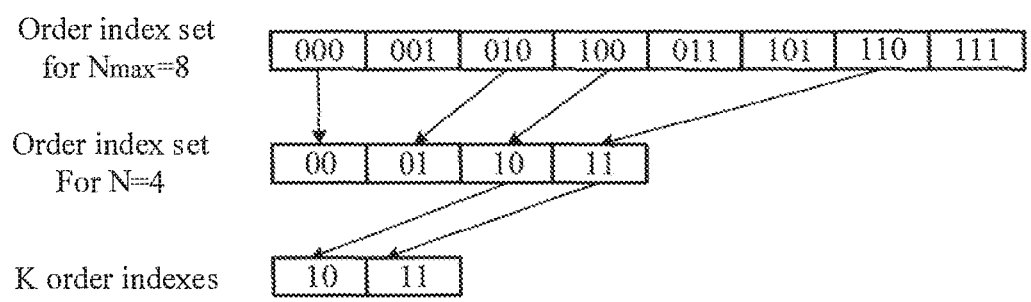
FIG. 5 is a schematic diagram of an order index set for a parent code length and selected order indexes according to the first embodiment of the present disclosure.

If the parent code length of the polar code is smaller than the maximum possible parent code length $N_{max}$, order indexes with number equal to the parent code length may be selected from the first order index set, and order indexes of the order index set for the parent code length may be generated based on the selected order indexes. For example, the order indexes with number equal to the parent code length may be selected according to high significant bits of respective order indexes in the first order index set, and order indexes of the second order index set for the parent code length may be generated based on the selected order indexes. For example, order indexes, with number corresponding to the parent code length, of which values of the high significant bits are smaller than the parent code length and values of the remaining bits (low significant bits) are all 0 or all 1 may be selected from the first order index set. In the first order index set shown in FIG. 2, assuming that the parent code length N is 4, order indexes 000, 010, 100 and 110, with number corresponding to the parent code length, of which values of high significant bits (2 high significant bits, i.e, the most significant bit and the next most significant bit) are smaller than the parent code length 4 and values of the remaining bits are 0 may be selected from the first order index set. Then, since there are only 4 bit positions in a case that the parent code length is 4 and the 4 bit positions may be represented using 2 bits, the last bit of each of the selected order indexes 000, 001, 100 and 110 may be removed, thereby generating order indexes "00, 01, 10, 11" of the second order index set for the parent code length N=4, as shown in FIG. 5. It should be appreciated that, other manners may be used to select order indexes with number equal to the parent code length from the first order index set, and generate order indexes of the order index set for the parent code length based on the selected order indexes. For example, the order indexes with number equal to the parent code length may be selected according to low significant bits of the respective order indexes in the first order index set, and order indexes of the second order index set for the parent code length may be generated based on the selected order indexes. For example, order indexes, with number corresponding to the parent code length, of which values of the low significant bits are smaller than the parent code length and values of the remaining bits (high significant bits) are all 0 or all 1 may be selected from the first order index set, thus order indexes of the second order index set for the parent code length are obtained. Moreover, for example, in the first order index set shown in FIG. 2, assuming that the parent code length N is 4, the first, third, fifth and seventh order indexes or the second, fourth, sixth and eighth order indexes may be selected from the first order index set, and order indexes of the order index set for the parent code length may be generated based on the selected order indexes.

In a second implementation, the first order index set is an order index set for code length $N_{middle}$ smaller than the maximum possible parent code length $N_{max}$ of the polar code. In this case, the first order index set (herein, the predetermined code length is $N_{middle}$) may be determined in the manner of determining the order index set for the predetermined parent code length, as described above, which will not be described repeatedly herein.

In the implementation, if the code length N of the polar code to be generated is equal to $N_{middle}$, the first order index set may be used as the second order index set for the parent code length N of the polar code.

If the parent code length N of the polar code is smaller than $N_{middle}$, in the same manner as the first implementation, order indexes with number equal to the parent code length N may be selected from the first order index set, and order indexes of the order index set for the parent code length N may be generated based on the selected order indexes. If the parent code length N of the polar code to be generated is larger than $N_{middle}$, an order index set for the parent code length N of the polar code to be generated may be constructed (generated) by spreading the first order index set. A variety of ways may be used to construct the order index set for the parent code length of the polar code to be generated. For example, the first order index set for parent code length 4 is {a, b, c, d}, where 0<=a, b, c, d<4 and the parent code length for the polar code to be generated is 8, the first order index set may be spread to {2a, 2a+1, 2b, 2b+1, 2c, 2c+1, 2d, 2d+1} as the order index set for the parent code length of the polar code to be generated. Take a first order index set for parent code length 8 shown in FIG. 2 as an example. Assuming that the parent code length for the polar code to be generated is 16, a second order index set for the parent code length 16 may be constructed based on the first order index set for the parent code length 8. In an example, decimal number represented by each order index of a first order index set may be multiplied by 2 to obtain 0, 2, 4, 8, 6, 10, 12, 14, then the decimal number represented by each order index of the first order index set is multiplied by 2 and added by 1 to obtain 1, 3, 5, 9, 7, 11, 13, 15, then the above two may be combined to obtain an order index set "0, 1, 2, 3, 4, 5, 8, 9, 6, 7, 10, 11, 12, 13, 14, 15" as the second order index set for the parent code length 16.

In this embodiment, the first order index set may be one of order index sets shown in FIGS. 2(1)-2(19), in which case the second order index set may be generated based on the first order index sets shown in FIGS. 2(1)-2(19) in the manner described above or other manners. Alternatively, the second order index set may be one of the order index sets shown in FIGS. 2(1)-2(19), in which case the second order index set may be generated based on the first order index set (may be one of the order index sets shown in FIGS. 2(1)-2(19) or other order index set) in the manner described above or other manners.

With continued reference to FIG. 4, in step 402, the input data sequence is spread to a data sequence with bit number equal to the parent code length N according to the second order index set.

In particular, since the input data sequence has K bits and needs to be spread to a data sequence having N bits, it is necessary to insert the frozen bits in N–K bit positions of N bit positions, and to place information bits of the input data sequence in the remaining K bit positions. To this end, order indexes with number equal to the bit number K of the input data sequence may be selected from the second order index set according to the priority orders represented by respective order indexes of the second order index set. In particular, the K order indexes may be selected in a descending order of the priority orders. Then, respective bits of the input data sequence may be sequentially placed in bit positions indicated by the selected order indexes, and the frozen bits may be placed in other bit positions, thereby generating a data sequence with bit number equal to the parent code length N. Take FIG. 4 as an example. Assuming K=2, 2 order indexes need to be selected. In this example, priority orders represented by order indexes on the right side is high, and therefore, 2 order indexes 100 and 110 are selected in a right-to-left order, as shown in FIG. 5, and 2 information bits of the input data sequence are placed in bit position 2 and bit position 3 indicated by the two order indexes, while the frozen bits are inserted in bit positions 0 and 1, thereby generating a spread data sequence of length 4.

Back to FIG. 4, in step S403, polar coding is performed on the spread data sequence to generate the polar code. In particular, the spread data sequence may be subjected to basic polar coding to generate a parent polar code having a parent code length of N, and then rate matching is performed on the parent polar code to generate a polar code having a code length of M. Basic polar coding and rate matching may be performed using methods known in the art, which will not be described repeatedly herein. It should be noted that, the method of selecting order indexes described above may be adaptively changed according to a method used for rate matching, thereby selecting order indexes that matches the method used for rate matching.

Figure 6:
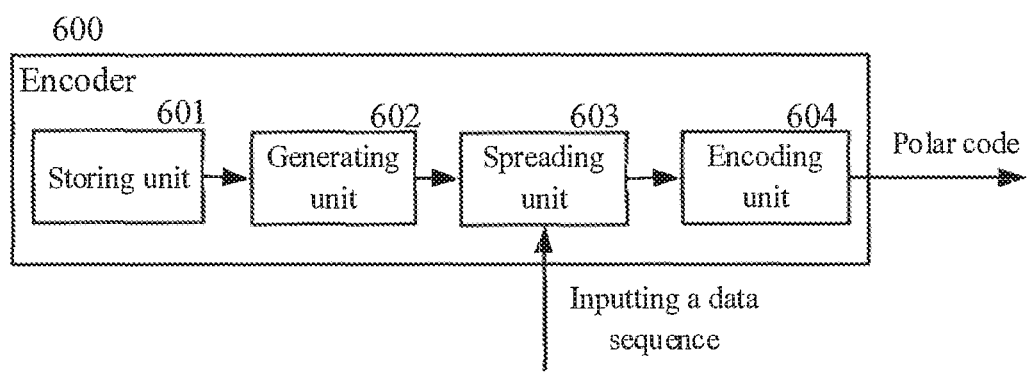
FIG. 6 is a block diagram of an encoder according to the first embodiment of the present disclosure.

An encoder according to the first embodiment of the present invention will be described below with reference to FIG. 6. The encoder may execute the method shown in FIG. 4 and may be included in a base station or a mobile station. Since details of operation executed by the encoder is the same as the method shown in FIG. 4, description of the same content is omitted herein. As shown in FIG. 6, the encoder 600 comprises a storing unit 601, a generating unit 602, a spreading unit 603 and an encoding unit 604.

The storing unit 601 stores the first order index set. As described above, each order index of the first or second order index set represents a priority order of transmitting an information bit in a bit position indicated by the order index relative to transmitting information bits in bit positions indicated by other indexes, and may be the order index sets described above, for example. As described above, the first order index set may be pre-generated and stored in the storing unit 601. The generating unit 602 may generate the second order index set for the parent code length N of the polar code based on the first order index set.

In a first implementation, the first order index set is an order index set for the maximum possible parent code length $N_{max}$ of the polar code. As described above, bit positions indicated by respective order indexes of the order index set for the maximum possible parent code length are bit positions selected respectively according to error probabilities, calculated based on different channel conditions, of receiving information bits when transmitting the information bits in respective bit positions.

If the parent code length N of the polar code is equal to the maximum possible parent code length $N_{max}$, the generating unit 602 may take the first order index set as the second order index set for the parent code length N of the polar code. If the parent code length N of the polar code is smaller than the maximum possible parent code length $N_{max}$, the generating unit 602 may select order indexes with number equal to the parent code length from the first order index set, and generate order indexes of the order index set for the parent code length based on the selected order indexes. For example, the generating unit 602 may select the order indexes with number equal to the parent code length according to high significant bits or low significant bits of each order index in the first order index set, and generate order indexes of the second order index set for the parent code length based on the selected order indexes.

In a second implementation, the first order index set is an order index set for code length $N_{middle}$ smaller than the maximum possible parent code length $N_{max}$ of the polar code. In this case, the first order index set (herein, the predetermined code length is $N_{middle}$) may be determined in the manner of determining the order index set for the predetermined parent code length, as described above, which will not be described repeatedly herein.

In the implementation, if the code length N of the polar code to be generated is equal to $N_{middle}$, the generating unit 602 may take the first order index set as the second order index set for the parent code length N of the polar code.

If the parent code length N of the polar code is smaller than $N_{middle}$, in the same manner as the first implementation, the generating unit 602 may select order indexes with number equal to the parent code length N from the first order index set, and generate order indexes of the order index set for the parent code length based on the selected order indexes.

If the parent code length N of the polar code to be generated is larger than $N_{middle}$, the generating unit 602 may construct (generate) the order index set for the parent code length N of the polar code to be generated by spreading the first order index set. The generating unit 602 may construct (generate) the order index set for the parent code length N of the polar code to be generated in the manner described above with reference to FIG. 4, which will not be described repeatedly herein.

The spreading unit 603 may spread an input data sequence to a data sequence with bit number equal to the parent code length N according to a second order index set. In particular, since the input data sequence has K bits and needs to be spread to a data sequence having N bits, it is necessary to insert the frozen bits in N−K bit positions of N bit positions, and to place information bits of the input data sequence in the remaining K bit positions. To this end, the spreading unit 603 may select order indexes with number equal to the bit number K of the input data sequence from the second order index set according to the priority orders represented by respective order indexes of the second order index set. In particular, the spreading unit 603 may select the K order indexes in a descending order of the priority orders. Then, the spreading unit 603 may sequentially place respective bits of the input data sequence in bit positions indicated by the selected order indexes, and place the frozen bits in other bit positions, thereby generating a data sequence with bit number equal to the parent code length N.

The encoding unit 604 may perform polar coding on the spread data sequence to generate the polar code. In particular, the encoding unit 604 may perform basic polar coding on the spread data sequence to generate a parent polar code having a parent code length of N, and then perform rate matching on the parent polar code to generate a polar code having a code length of M. The encoding unit 604 may perform basic polar coding and rate matching using methods known in the art, which will not be described repeatedly herein.

In the first embodiment of the present disclosure, an order index set may be pre-generated and stored for a predetermined parent code length (for example, maximum possible parent code length), and when the parent code length of a polar code to be generated is different from the maximum possible parent code length, an order index set for the parent code length of the polar code to be generated is generated based on the order index set for the maximum possible parent code length. Thus, it is not necessary to pre-generate and store order index sets for all possible parent code lengths, thereby saving storage space. Since the parent code length of the polar code to be generated is smaller than the maximum possible parent code length, no significant latency will arise even if the order index set for the polar code to be generated is determined instantaneously.

A method for performing polar coding on an input data sequence to generate a polar code according to a second embodiment is described below.

Figure 7:
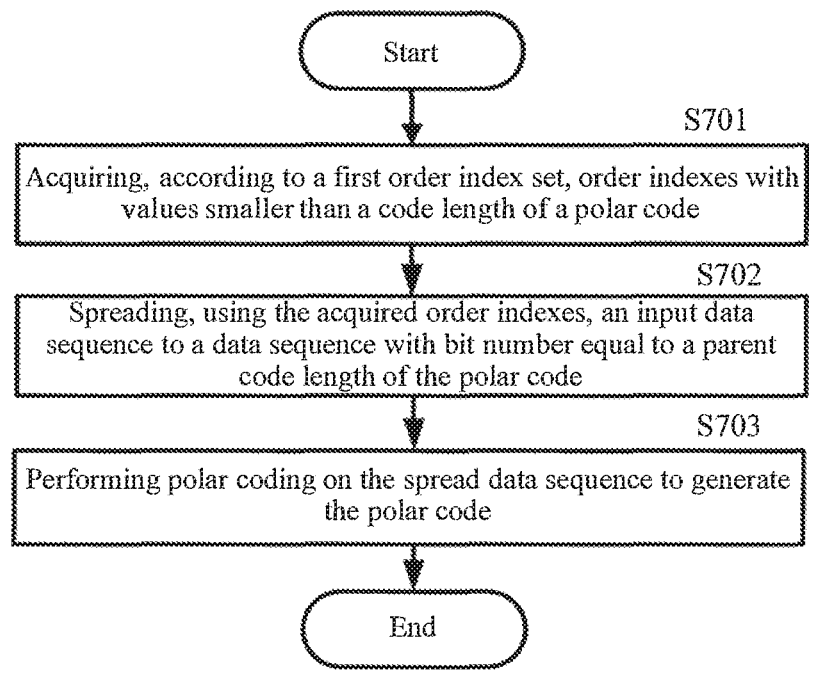
FIG. 7 is a flow chart of a method for performing polar coding on an input data sequence to generate a polar code according to a second embodiment of the present disclosure.

As shown in FIG. 7, in step S701, order indexes with values smaller than code length of the polar code are acquired according to a first order index set. As described above, each order index of the first order index set represents a priority order of transmitting an information bit in a bit position indicated by the order index relative to transmitting information bits in bit positions indicated by other indexes.

In a first implementation, the first order index set is an order index set for the maximum possible parent code length $N_{max}$ of the polar code. As described above, bit positions indicated by respective order indexes of the order index set for the maximum possible parent code length of the polar code are bit positions selected respectively according to error probabilities, calculated based on different channel conditions, of receiving information bits when transmitting the information bits in respective bit positions. The order index set for the maximum possible parent code length of the polar code may be determined in the manner described above, which will not be described repeatedly herein.

Figure 8A:
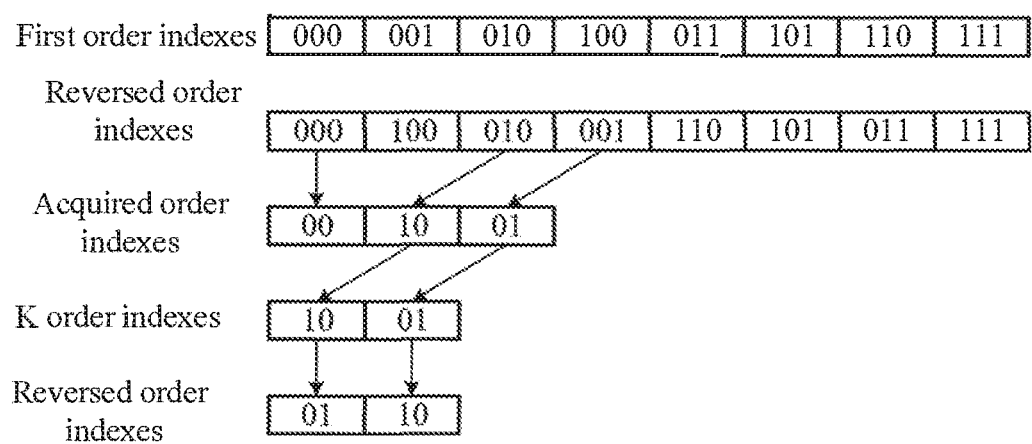
FIG. 8A is an example of acquiring order indexes according to a first order index set according to the second embodiment of the present disclosure.
Figure 8B:
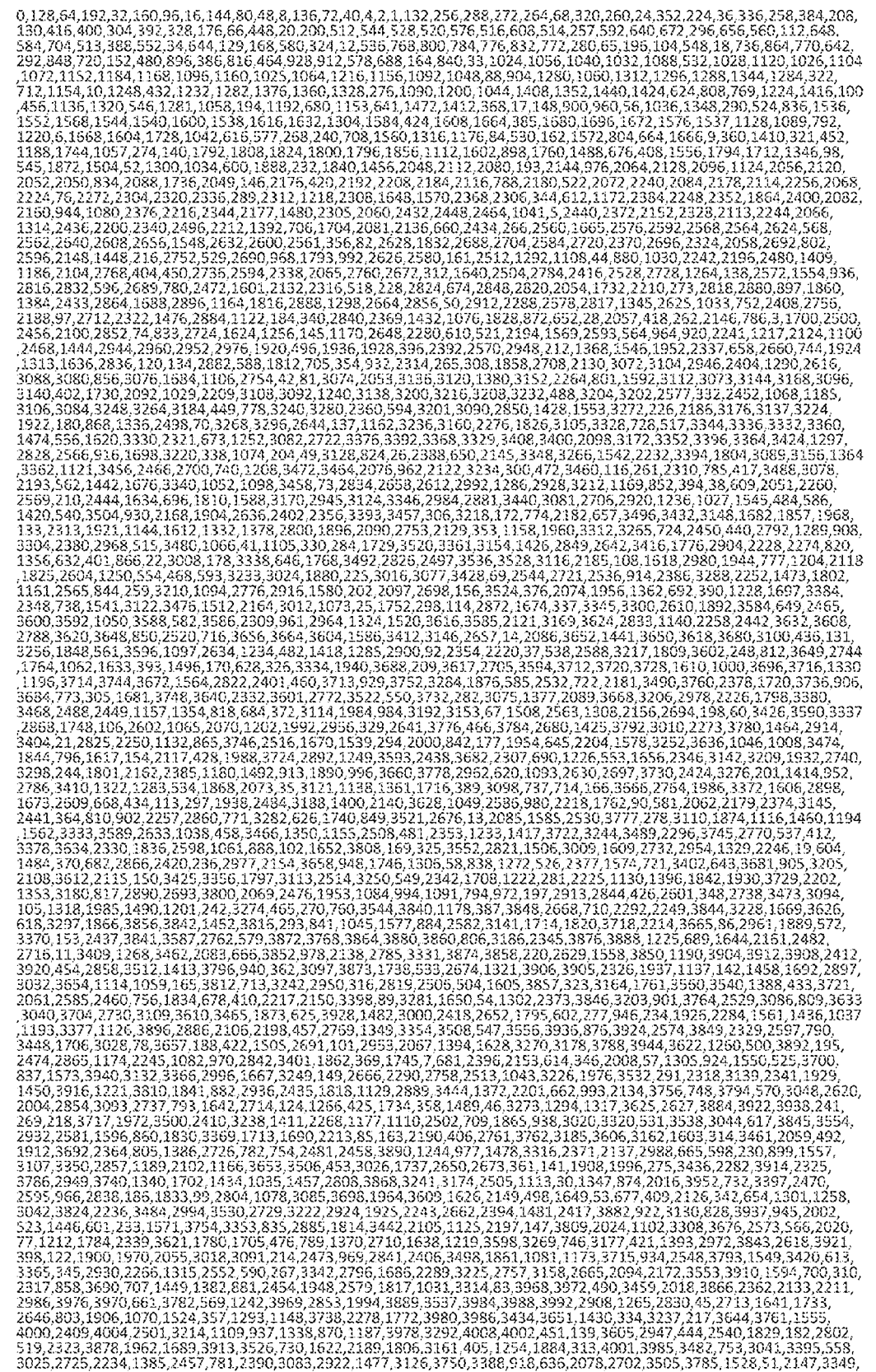
Figure 8B:
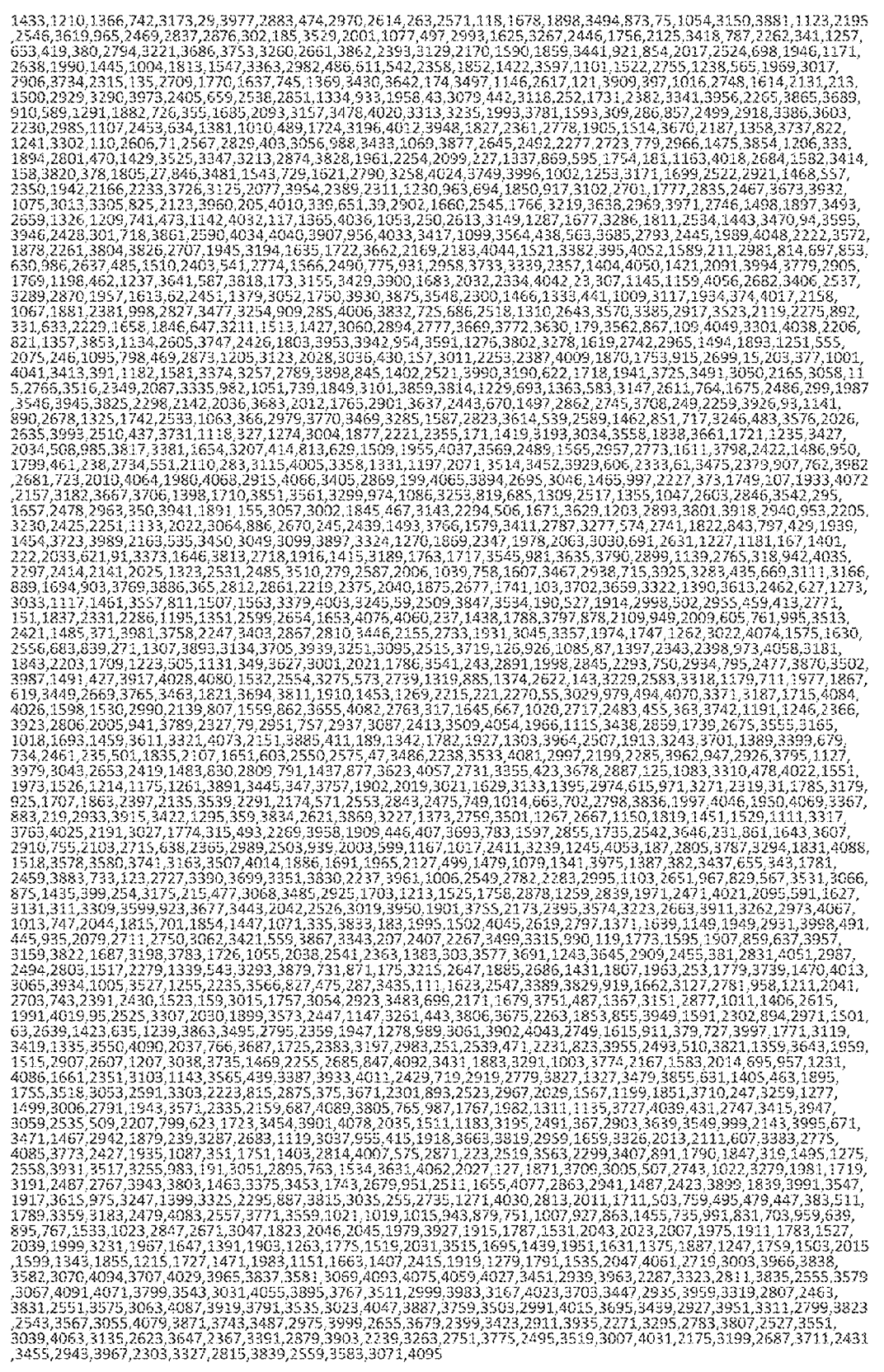
Figure 8C:
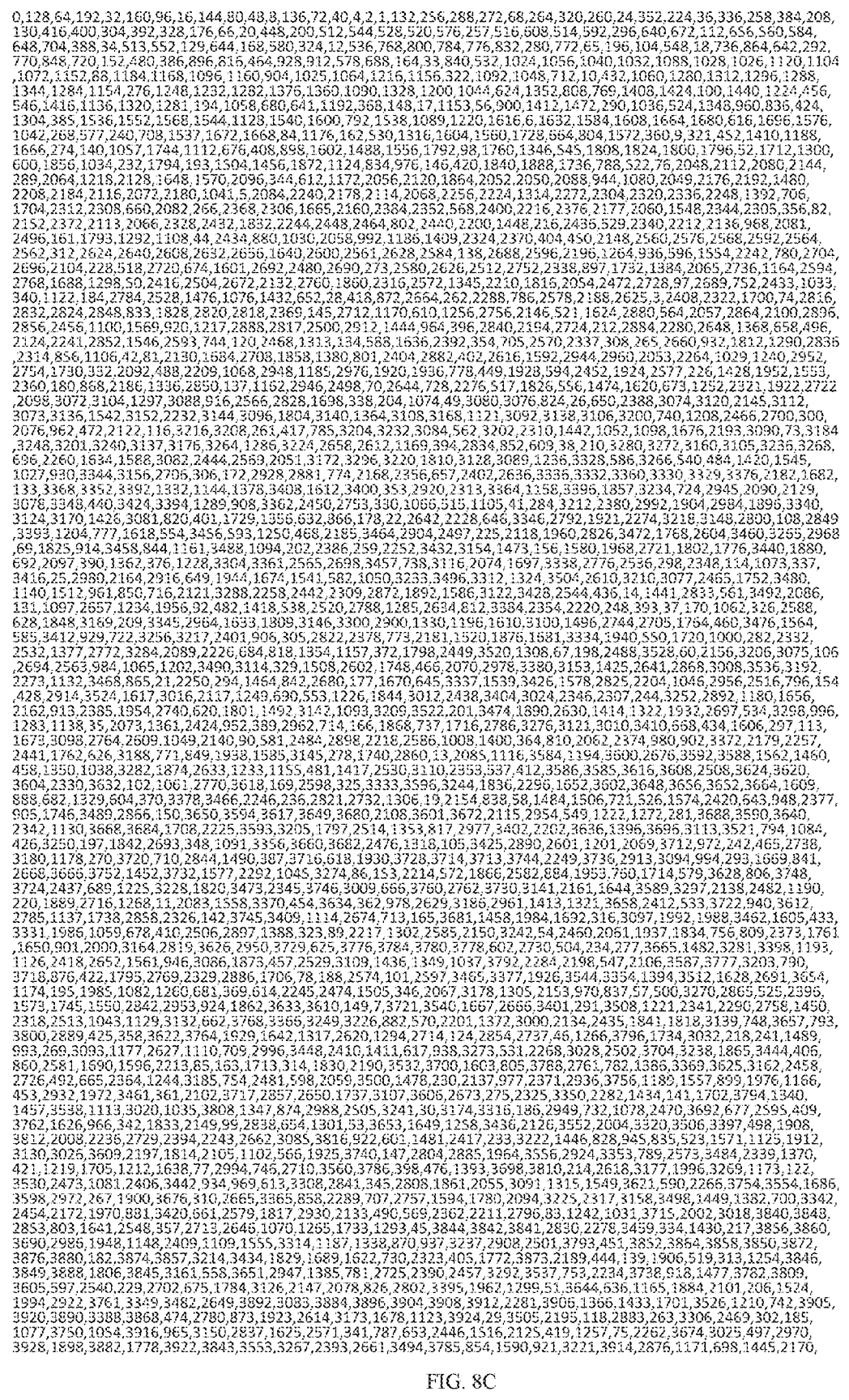
Figure 8C:
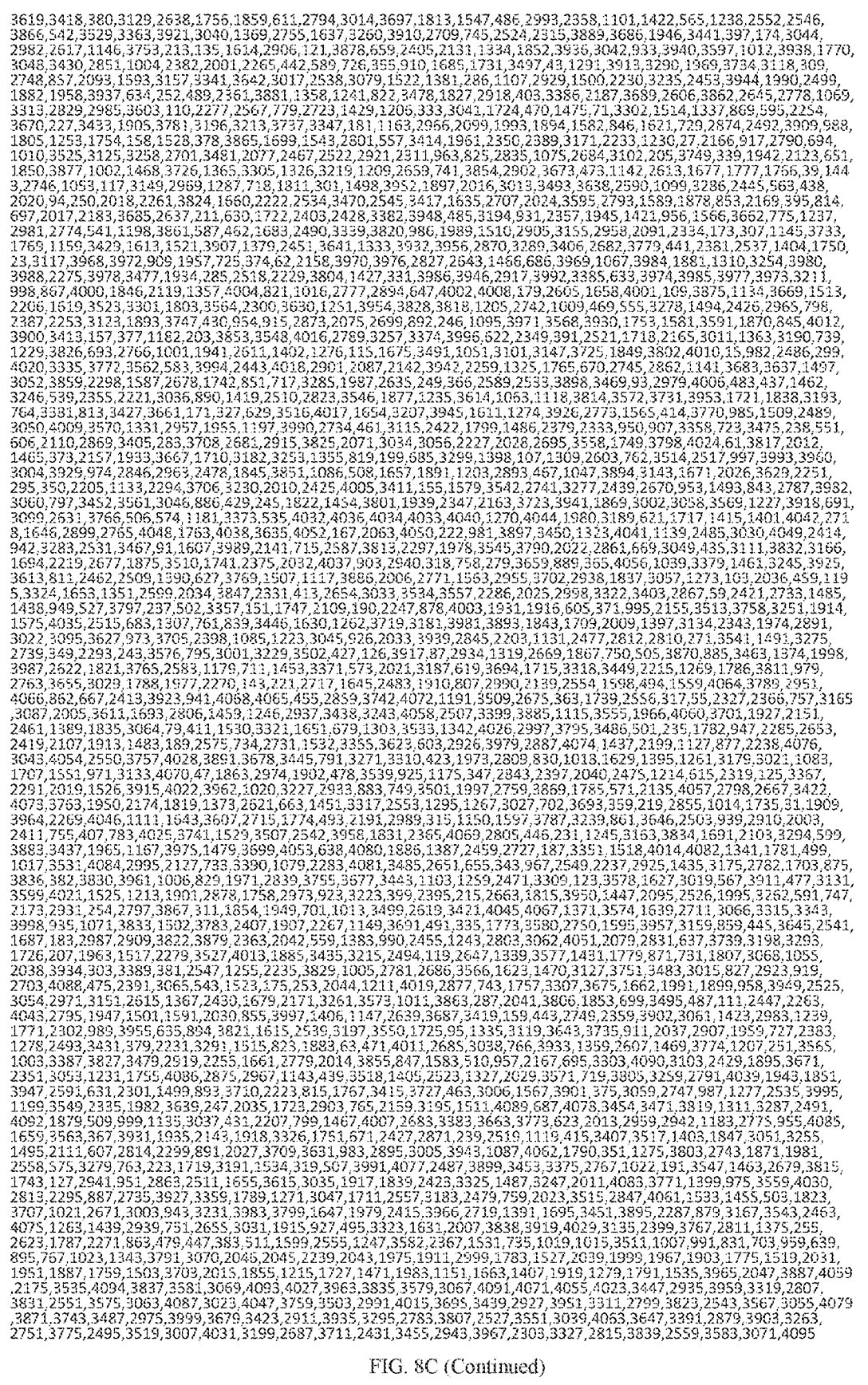
Figure 8D:
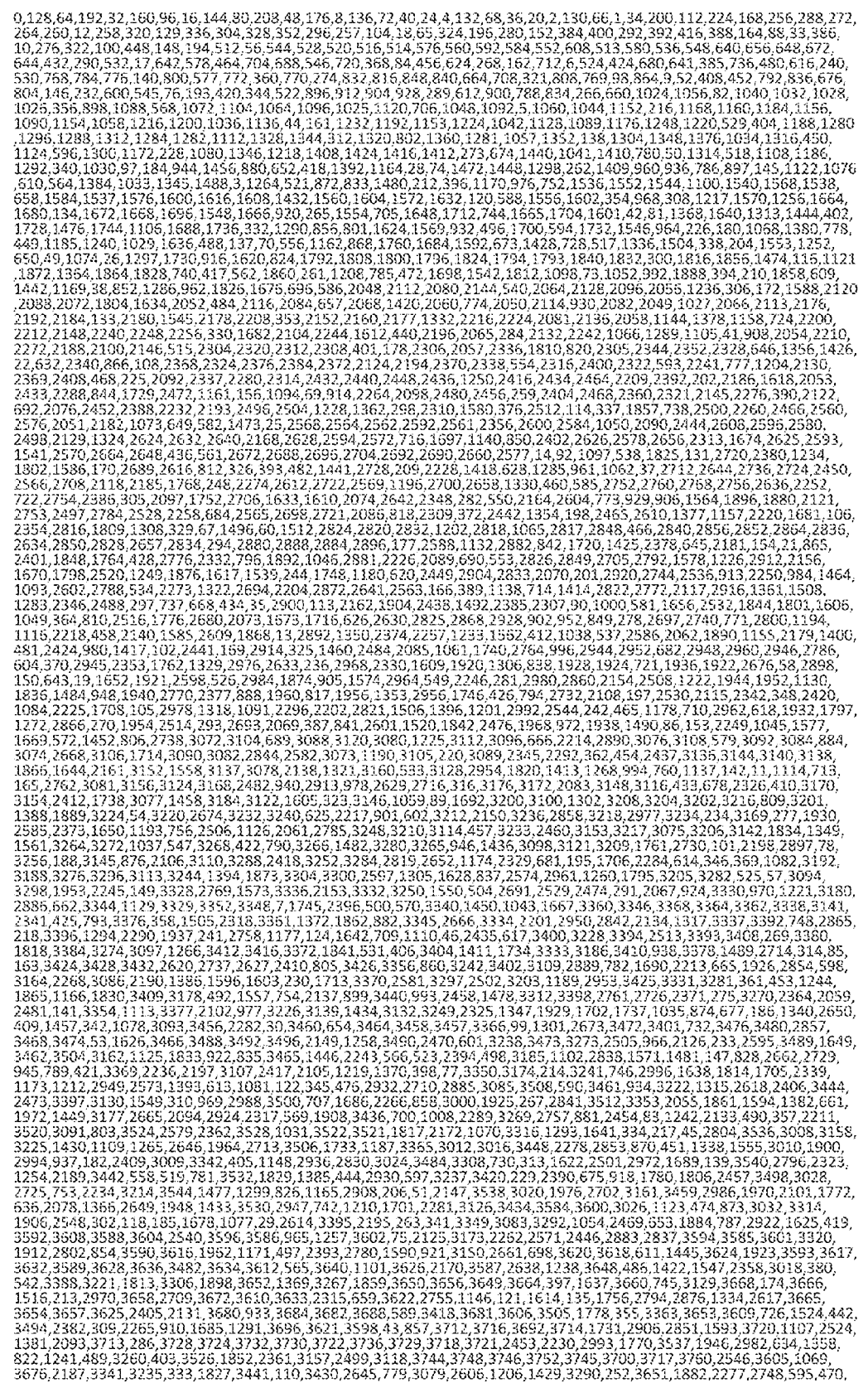
Figure 8D:
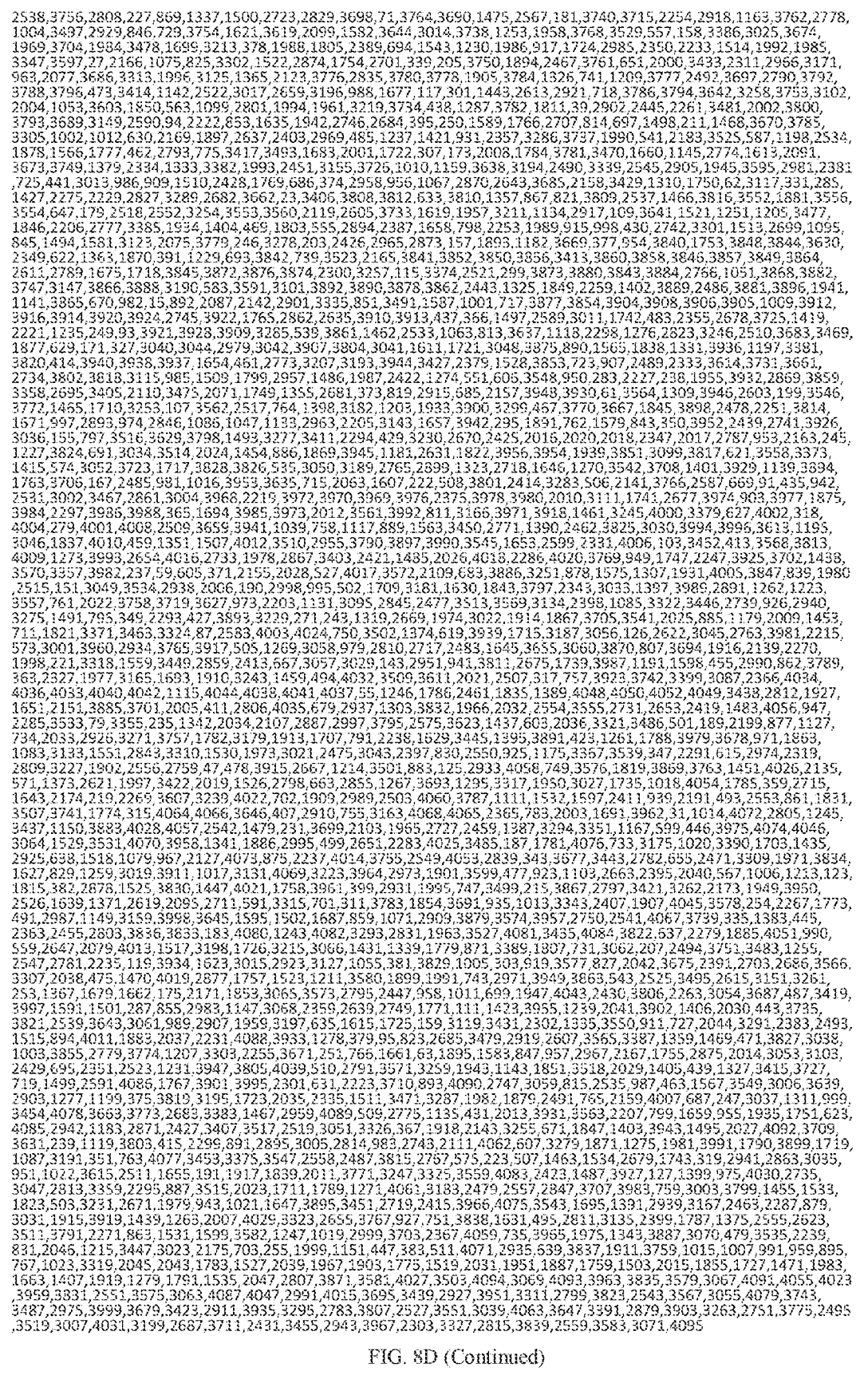
Figure 8E:
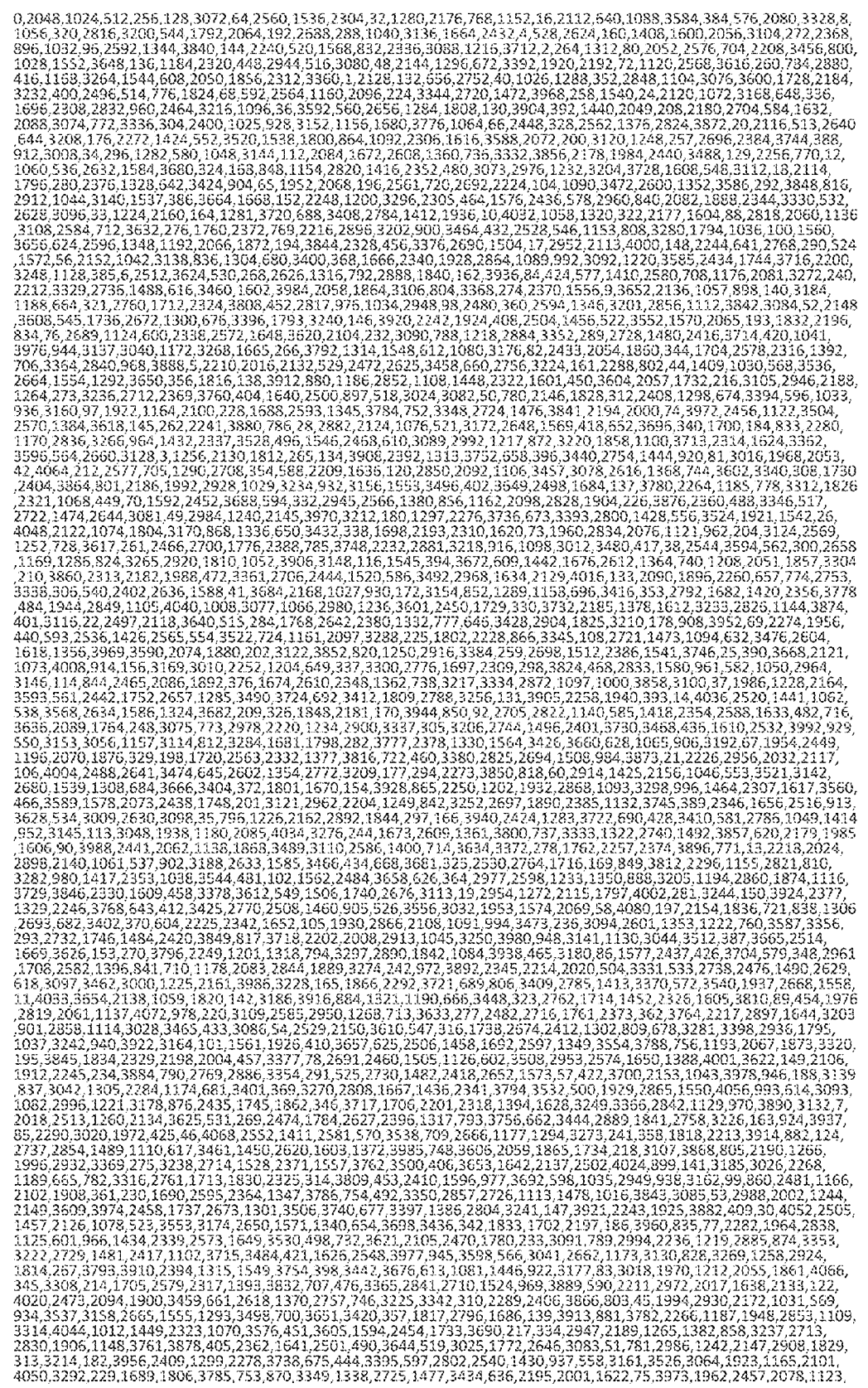
Figure 8E:
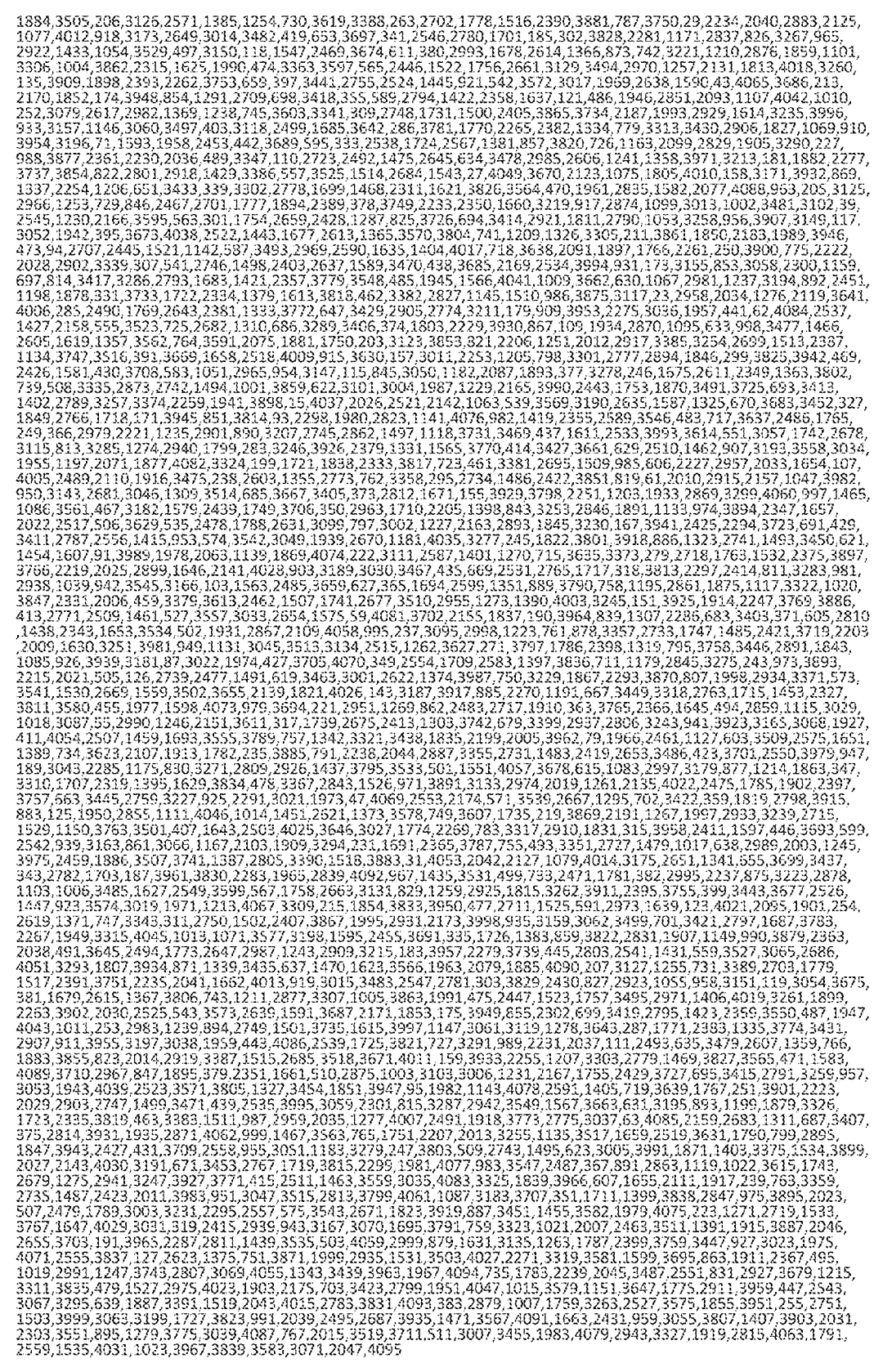

In this case, each order index of the first order index set may be bit-reversed to generate a reversed order index set. Take the first order index shown in FIG. 2 as an example. Bit-reversal are performed on each order index of the first order index set to generate a reversed order index set "000, 100, 010, 001, 110, 101, 011, 111", as shown in FIG. 8A. For another example, when the first order index set is an order index set for a parent code length 4096, reversed order index sets generated by reversing it may be as shown in FIGS. 8B-8E. Then, order indexes with values smaller than the code length of the polar code may be selected from the reversed order index sets. In the example of FIG. 8A, assuming that code length M of the polar code is 3, order indexes with values smaller than 3 may be selected from the reversed order index set. Since the selected order indexes are less than 4, corresponding bit positons may be represented using only 2 bits.

In a second implementation, the first order index set is obtained by bit-reversal of order indexes of the order index set for the maximum possible parent code length of the polar code. In the example of FIG. 8A, the first order index set is no longer the order index set shown in the first row, but the reversed order index set shown in the second row. In the example where the maximum possible parent code length is 4096, the first order index set is the reversed order index shown in FIG. 8B-FIG. 8E. In this case, order indexes with values smaller than the code length of the polar code may be selected from the first order index set (reversed order index set) in step S701.

In this embodiment, the first order index set may be one of the order index sets shown in FIG. 2(1)-2(19), in which case order indexes with values smaller than the code length of the polar code may be acquired based on the first order index sets shown in FIGS. 2(1)-2(19) in the manner described above or other manners. Alternatively, the order indexes with values smaller than the code length of the polar code may also be one of the order index sets shown in FIGS. 2(1)-2(19), in which case the order indexes with values smaller than the code length of the polar code may be acquired based on the first order index set (may be one of the order index sets shown in FIGS. 2(1)-2(19) or other order index set) in the manner described above or other manners.

Back to FIG. 7, in step S702, the input data sequence is spread to a data sequence with bit number equal to the code length of the polar code using the acquired order indexes.

In a first implementation, first, order indexes with number equal to the bit number of the input data sequence may be selected from the respective acquired order indexes according to the priority orders represented by the respective acquired order indexes. In the example shown in FIG. 8A, assuming that the bit number K of the input data sequence is 2, 2 order indexes may be selected in a right-to-left order from the acquired order indexes. Then, the selected order indexes are bit-reversed to generate reversed order indexes. In the example of FIG. 8A, reversed order indexes 01 and 10 are generated. Respective bits of the input date data sequence may be placed in bit positions indicated by the reversed order indexes, and the frozen bits may be placed in other bit positions, thereby generating a data sequence with bit number equal to the parent code length of the polar code. In the example of FIG. 8A, 2 bits of the input data sequence may be sequentially placed in bit positions 1 and 2 indicated by the reversed order indexes, and the frozen bits may be placed in bit positions 0 and 3, thereby generating a data sequence of length 4.

In a second implementation, first, order indexes with number equal to the bit number of the input data sequence may be selected from the respective acquired order indexes according to the priority orders represented by the respective acquired order indexes. Then, respective bits of the input data sequence may be sequentially placed in bit positions indicated by the K selected order indexes, and the frozen bits may be placed in other bit positions, thereby generating a data sequence with bit number equal to the code length of the polar code.

With continued reference to FIG. 7, in step S703, polar coding is performed on the spread data sequence to generate the polar code. In particular, basic polar coding may be performed on the spread data sequence to generate a parent polar code having a parent code length of N, and then rate matching is performed on the parent polar code to generate a polar code having a code length of M. Basic polar coding and rate matching may be performed using methods known in the art, which will not be described repeatedly herein.

Figure 9:
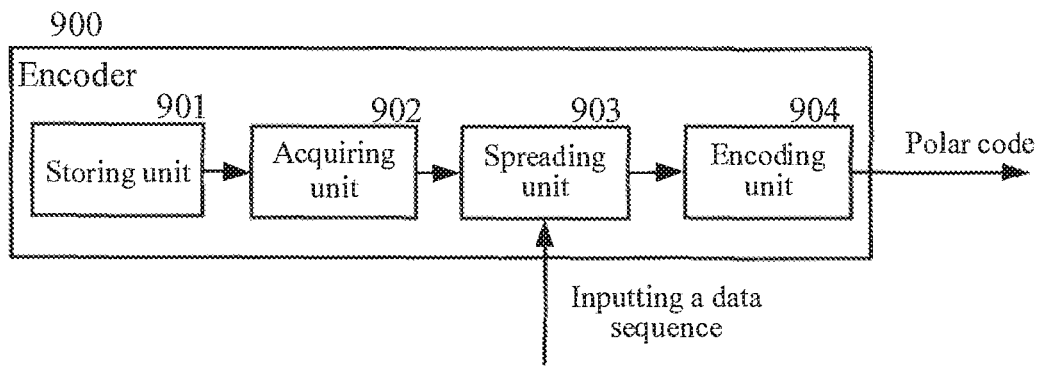
FIG. 9 is a block diagram of an encoder according to the second embodiment of the present disclosure.

An encoder according to the second embodiment of the present invention will be described below with reference to FIG. 9. The encoder may execute the method shown in FIG. 7 and may be included in a base station or a mobile station. Since details of operation executed by the encoder is the same as the method shown in FIG. 7, description of the same content is omitted herein. As shown in FIG. 9, the encoder 900 comprises a storing unit 901, an acquiring unit 902, a spreading unit 903 and an encoding unit 904.

The storing unit 901 stores the first order index set. As described above, each order index of the first order index set represents a priority order of transmitting an information bit in a bit position indicated by the order index relative to transmitting information bits in bit positions indicated by other indexes, and may be the order index sets described above, for example. As described above, the first order index set may be pre-generated and stored in the storing unit 901.

The acquiring unit 902 may acquire order indexes with values smaller than the code length of the polar code according to the first order index set.

In a first implementation, the first order index set is an order index set for the maximum possible parent code length of the polar code. As described above, bit positions indicated by respective order indexes of the order index set for the maximum possible parent code length of the polar code are bit positions selected respectively according to error probabilities, calculated based on different channel conditions, of receiving information bits when transmitting the information bits in respective bit positions. The order index set for the maximum possible parent code length of the polar code may be generated in the manner described above, which will not be described repeatedly herein. In this case, the acquiring unit 902 may perform bit-reversal on respective order indexes of the first order index set to generate a reversed order index set. Then, the acquiring unit 902 may select order indexes with values smaller than the code length of the polar code from the reversed order index set.

In a second implementation, the first order index set is an order index set obtained by bit-reversal of order indexes in the order index set for the maximum possible parent code length of the polar code. In this case, the acquiring unit 902 may select order indexes with values smaller than the code length of the polar code from the first order index set.

The spreading unit 903 may spread the input data sequence to a data sequence with bit number equal to the parent code length of the polar code using the acquired order indexes.

In a first implementation, the spreading unit 903 may select order indexes with number equal to the bit number of the input data sequence from the respective acquired order indexes according to the priority orders represented by the respective acquired order indexes. Then, the spreading unit 903 may perform bit-reversal on the selected order indexes to generate reversed order indexes. Then, the spreading unit 903 may sequentially place respective bits of the input data sequence in bit positions indicated by the reversed order indexes, and place the frozen bits in other bit positions, thereby generating a data sequence with bit number equal to the parent code length of the polar code.

In a second implementation, the spreading unit 903 may select order indexes with number equal to the bit number of the input data sequence from the respective acquired order indexes according to the priority orders represented by the respective acquired order English Translation of indexes. Then, the spreading unit 903 may sequentially place respective bits of the input data sequence in bit positions indicated by the selected K order indexes, and place the frozen bits in other bit positions, thereby generating a data sequence with bit number equal to the parent code length of the polar code.

The encoding unit 904 may perform polar coding on the spread data sequence to generate the polar code. In particular, the encoding unit 904 may perform basic polar coding on the spread data sequence to generate a parent polar code having a parent code length of N, and then perform rate matching on the parent polar code to generate a polar code having a code length of M. The encoding unit 904 may perform basic polar coding and rate matching using methods known in the art, which will not be described repeatedly herein.

In the second embodiment of the present disclosure, an order index set may be pre-generated and stored for a predetermined parent code length (for example, maximum possible parent code length), and when the parent code length of a polar code to be generated is different from the maximum possible parent code length, the input data sequence is spread based on the order index set for the maximum possible parent code length. Thus, it is not necessary to pre-generate and store order index sets for all possible parent code lengths, thereby saving storage space. Alternatively, instead of storing order index sets for the predetermined parent code length, order index set generated by bit-reversal of order indexes of the order index set for the predetermined parent code length may also be stored directly, such that it is not necessary to execute bit-reversal operation again during actual communication, thereby further reducing amount of calculation.

A method for performing polar coding on an input data sequence to generate a polar code according to a third embodiment of the present disclosure will be described below.

Figure 10:
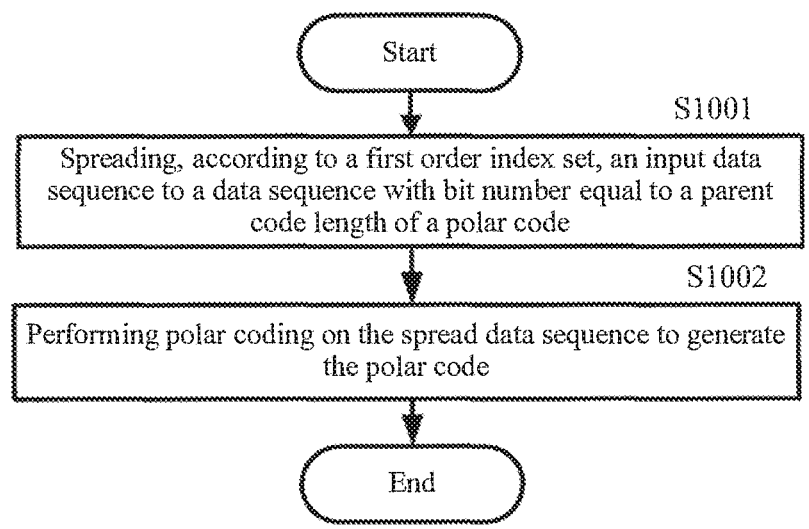
FIG. 10 is a flow chart of a method for performing polar coding on an input data sequence to generate a polar code according to a third embodiment of the present disclosure.

As shown in FIG. 10, in step S1001, the input data sequence is spread to a data sequence with bit number equal to a parent code length of the polar code according a first order index set. The first order index set may be the order index set described above with reference to the first embodiment, for example, one of the order index sets shown in FIGS. 2(1)-2(19). In this case, the first order index set has order indexes with number equal to the parent code length of the polar code. In other words, for example, when one of the order index sets shown in FIGS. 2(1)-2(19) has order indexes with number equal to the parent code length of the polar code, the order index set may be directly used to spread the input data sequence. As described above, each order index of the first order index set represents a priority order of transmitting an information bit in a bit position indicated by the order index relative to transmitting information bits in bit positions indicated by other indexes.

In particular, since the input data sequence has K bits and needs to be spread to a data sequence having N bits, it is necessary to insert the frozen bits in N–K bit positions of N bit positions, and to place information bits of the input data sequence in the remaining K bit positions. To this end, order indexes with number equal to the bit number K of the input data sequence may be selected from the first order index set according to priority orders represented by respective order indexes of the first order index set. For example, the K order indexes may be selected in a descending order of the priority orders. Then, respective bits of the input data sequence may be sequentially placed in bit positions indicated by the selected order indexes, and the frozen bits may be placed in other bit positions, thereby generating a data sequence with bit number equal to the parent code length N.

Then, in step S1002, polar coding is performed on the spread data sequence to generate the polar code. In particular, basic polar coding may be performed on the spread data sequence to generate a parent polar code having a parent code length of N, rate matching is then performed on the parent polar code to generate a polar code having a code length of M. Basic polar coding and rate matching may be performed using methods known in the art, which will not be described repeatedly herein. It should be noted that, the method of selecting order indexes described above may be adaptively changed according to a method used for rate matching, thereby selecting order indexes that matches the method used for rate matching.

An encoder according to the third embodiment of the present invention will be described below with reference to FIG. 11. The encoder may execute the method shown in FIG. 10 and may be included in a base station or a mobile station. Since details of operation executed by the encoder is the same as the method shown in FIG. 10, description of the same content is omitted herein.

Figure 11:
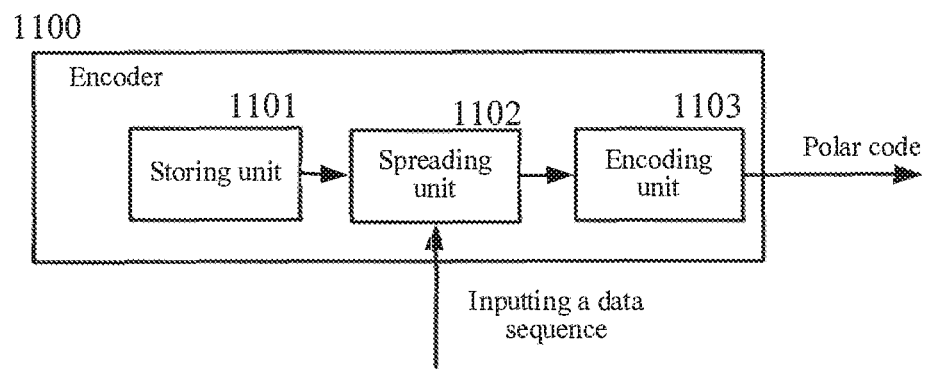
FIG. 11 is a block diagram of an encoder according to the third embodiment of the present disclosure.

As shown in FIG. 11, the encoder 1100 comprises a storing unit 1101, a spreading unit 1102 and an encoding unit 1103.

The storing unit 1101 stores the first order index set. As described above, each order index of the first order index set represents a priority order of transmitting an information bit in a bit position indicated by the order index relative to transmitting information bits in bit positions indicated by other indexes. As described above, the first order index set may be pre-generated and stored in the storing unit 1101, and be may be one of the order index sets shown in FIGS. 2(1)-2(19).

The spreading unit 1102 may spread the input data sequence to a data sequence with bit number equal to the parent code length of the polar code using the first order set.

The encoding unit 1103 may perform polar coding on the spread data sequence to generate the polar code. In particular, the encoding unit 1103 may perform basic polar coding on the spread data sequence to generate a parent polar code having a parent code length of N, and then perform rate matching on the parent polar code to generate a polar code having a code length of M. The encoding unit 1103 may perform basic polar coding and rate matching using methods known in the art, which will not be described repeatedly herein.

It should be noted that block diagrams used for the description of the above embodiments represent functional blocks of functional units. These functional blocks (components) may be implemented in arbitrary combination of hardware and/or software. Also, the means for implementing each functional block is not particularly limited. That is, the respective functional blocks may be implemented by one apparatus that is physically and/or logically jointed; or more than two apparatuses that are physically and/or logically separated may be directly and/or indirectly (e.g., wiredly and/or wirelessly) connected, and the respective functional blocks may be implemented by these apparatuses.

Figure 12:
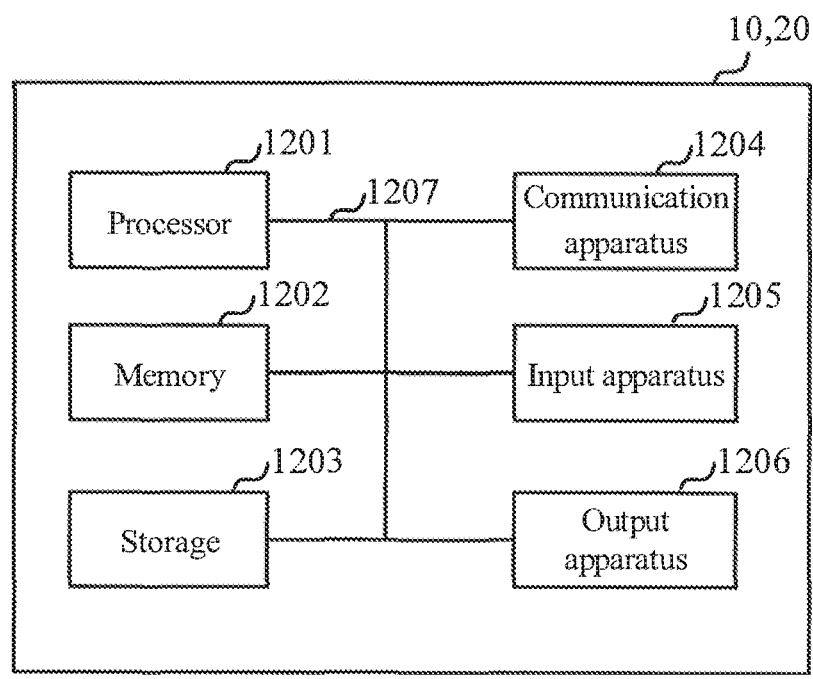
FIG. 12 is a diagram of an example showing hardware constitution of a wireless base station and a user terminal according to an embodiment of the present invention.

For example, the wireless base station, the user terminal and so on according to the embodiments of the present invention may function as computers that execute the processes of the wireless communication methods of the present invention. FIG. 12 is a diagram of an example showing hardware constitution of a wireless base station and a user terminal according to an embodiment of the present invention. The above wireless base station 10 and the user terminal 20 may be physically constituted as computer apparatus comprising a processor 1201, a memory 1202, a storage 1203, a communication apparatus 1204, an input apparatus 1205, an output apparatus 1206, a bus 1207, etc., where the processor 1201 may act as the encoder described above and may execute the methods described above.

It should be noted that, in the following description, the term "apparatus" may be interpreted as a circuit, a device, a unit or the like. The hardware constitution of the wireless base station 10 and the user terminal 20 may be constituted to include one or more apparatuses shown in the figure, or may be constituted without including a part of the apparatuses.

Respective functions of the wireless base station 10 and the user terminal 20 are implemented by reading designated software (program) on hardware such as the processor 1201 and the memory 1202, by computation performed by the processor 1201, by the communication performed by controlling the communication apparatus 1204, and by reading and/or writing of data in the memory 1202 and the storage 1203.

The processor 1201, for example, operates an operating system to control the entire computer. The processor 1201 may be constituted by a central processing apparatus (CPU: central processing unit), which includes interfaces with peripheral apparatus, control apparatus, computing apparatus, a register, etc. For example, the respective encoders above may be implemented by the processor 1001.

In addition, the processor 1201 reads programs (program codes), software modules and data from the storage 1203 and/or the communication apparatus 1204 to the memory 1202, and execute various processing in accordance with contents thereof. As a program, a program causing the computers to execute at least a part of the operations described in the above embodiments is used. The above various processing is described for purpose of being executed in one processer 1201, but also may be performed simultaneously or sequentially by more than two processers 1201. The processer 1201 may be implemented with more than one chips. It should be noted that the program may be transmitted from a network via a communication circuit.

The memory 1202 is a computer-readable recording medium, and may be constituted, for example, by at least one of a ROM (a Read Only Memory), an EPROM (Erasable Programmable ROM), an EEPROM (Electrically Erasable Programmable ROM), a RAM (Random Access Memory), etc. The memory 1202 may be referred to as a register, a cache, a main memory (a main storage apparatus), etc. The memory 1202 can store executable programs (program code), software modules or the like for implementing the wireless communication method of an embodiment of the present invention.

The storage 1203 is a computer-readable recording medium, and may be constituted, for example, by at least one of an optical disk such as a CD-ROM (Compact Disc ROM), a hard disk drive, a floppy magnetic disk, a magneto-optical disk (e.g., a compact disk, a digital versatile disk and a Blu-ray disk (registered trademark)), a smart card, a flash memory (e.g., a flash memory card, a flash memory stick and a thin flash memory), a floppy disk (registered trademark) and a magnetic stripe. The storage 1203 may be referred to as an auxiliary storage device. The above storage medium may be other suitable mediums, for example, a database or a server comprising the memory 1202 and/or the storage 1203.

The communication apparatus 1204 is a hardware (transceiver device) performing communication between computers via a wired and/or wireless network, and is also referred to as a network device, a network controller, a network card, a communication module or the like, for example.

The input apparatus 1205 is an input device (e.g., a keyboard, a mouse, a microphone, a switch, a button, a sensor, etc.) that receives input from the outside. The output apparatus 1206 is an output device (e.g., a display, a speaker, a LED light, etc.) that performs output to the outside. It should be noted that the input apparatus 1205 and the output apparatus 1206 may be an integrated configuration (e.g., a touch screen).

In addition, the respective apparatuses such as the processor 1201 and the memory 1202 are connected by the bus 1207 that communicates information. The bus 1207 may be constituted by a single bus or by different buses between the apparatuses.

In addition, the wireless base station 10 and the user terminal 20 may be constituted by comprising hardware such as a microprocessor, a digital signal processor (DSP), an ASIC (Application Specified Integrated Circuit), a PLD (Programmable Logic Device), an FPGA (Field Programmable Gate Array), etc., and the hardware may be used to implement a part of or all of the respective functional block. For example, the processor 1201 may be implemented by at least one of the hardware.

The respective manners/implementations described in the present specification may be applied to LTE (Long Term Evolution), LTE-A (LTE-advanced), Beyond 3G, IMT-Advanced, 4G, 5G FRA (Future Radio Access), W-CDMA (registered trademark), GSM (registered trademark), CDMA2000, UMB (Ultra Mobile Broadband), IEEE802.11 (Wi-Fi), IEEE802.16 (WiMAX), IEEE802.20, UWB (Ultra Wide Broadband), Bluetooth (registered English Translation of trademark), a system using another proper wireless communication method and/or a next-generation system extended based thereon.

Orders of the processing steps, procedures, flow charts and the like of the respective manners/implementations described in the present invention may be changed as long as there is no contradiction. For example, in the methods explained in the present specification, elements of various steps are presented in illustrative order, but it is not limited to the presented particular order.

In the present specification, particular operations performed by the base station may be performed by an upper node thereof for some reasons in some cases. In a network comprised of one or a plurality of network nodes having the base station, it is obvious that various operations performed for communication with the terminal may be performed by the base station or other network nodes (e.g., MME (Mobility Management Entity), S-GW (Serving-Gateway) and so on, but the invention is not limited thereto) than the base station. Although a case where the number of other network nodes than the base station is one is exemplified in the above, a combination of a plurality of other network nodes (for example, MME and S-GW) is possible.

Input/output information may be stored in a specific place (such as the memory) or managed by a management table. The input/output information can be overwritten, updated or added. The output information may be deleted. The input information may be transmitted to other apparatuses.

The terms such as "deciding" and "determining" used in the present specification sometimes comprise a wide variety of operations. The "deciding" and "determining" may include regarding, for example, judging, calculating, computing, processing, deriving, investigating, looking up (e.g., looking up in a table, a database or other data structures) and ascertaining, as performing the "deciding" and "determining". In addition, the "deciding" and "determining" may include regarding receiving (e.g., receiving information), transmitting (for example, transmitting information), inputting, outputting and accessing (e.g., accessing data in the memory) as performing the "deciding" and "determining".

In addition, the "deciding" and "determining" may include regarding resolving, selecting, choosing, establishing, comparing and the like as performing the "deciding" and "determining". That is to say, the "deciding" and "determining" may include regarding certain operations as the "deciding" and "determining". The deciding may be performed by using a value (0 or 1) represented by 1 bit, or by using a true or false value (Boolean: true or false), or by using comparison of numerical values (for example, comparison with a designated value).

The manners/implementations described in the present specification may be used alone or in combination, or may be switched in accordance with execution. In addition, notification of designated information is not limited to being explicitly performed, and may be implicitly performed.

Irrespective of whether the software is called software, firmware, middle-ware, micro-code, hardware descriptive term, or other names, the software should be broadly interpreted as instructions, instruction sets, codes, code segments, program codes, program, sub-program, software module, application, software application, software package, routine, sub-routine, object, executable file, execution thread, procedure, function and the like.

In addition, software, instructions, etc. may be transmitted and received via a transmission medium. For example, in case that the software is transmitted from a web page, a server or other remote data source using wired technologies such as coaxial cables, fibers, twisted pairs and digital subscriber lines (DSLs) and/or wireless technologies such as infrared ray, radio and microwave, these wired technologies and/or wireless technologies are included in the definition of the transmission medium.

Information, signal or the like described in the present specification may be represented using any of a variety of different technologies. For example, data, instructions, commands, information, signal, bit, symbol, chip, etc. referred to throughout the above description may represent using voltage, current, electromagnetic waves, magnetic fields or magnetic particles, optical fields or photons, or any combination thereof.

It should be noted that terms described in the present specification and/or terms needed to understand the present specification may be replaced with terms having the same or similar meanings. For example, a channel and/or a symbol may be a signal. In addition, a signal may be a message.

In addition, information, parameter, etc. described in the present specification may be represented by an absolute value, a relative value to a designated value or other corresponding information. For example, a wireless resource may be indicated by an index. Names used for the above parameters are not restricted at any time. Furthermore, equations or the like using these parameters are sometimes different from those explicitly disclosed in the present specification. Various channels (e.g., PUCCHs, PDCCHs, etc.) and information elements (e.g., TPC, etc.) may be identified using any suitable names, so these various names allocated to the various channels and information elements are not restricted at any time.

The base station is capable of accommodating one or more (for example, three) cells (also referred to as sectors). In a case where the base station accommodates a plurality of cells, an entire coverage area of the base station is capable of being divided into a plurality of smaller areas, and each smaller area is capable of providing communication services using a base station sub-system (for example, a small base station RRH for indoor use: a remote radio head). The terms "cell" and "sector" refer to a part of or an entirety of a coverage area of the base station and/or a sub-system of the base station that providing communication services. Furthermore, the terms "base station", "eNB", "cell" and "section" can be used interchangeably in the present specification. The base station is sometimes also referred to as a fixed station, a NodeB, an eNodeB (eNB), an access point, a femto-cell, a small cell, etc.

The mobile station, depending on persons skilled in the art, is sometimes referred to as a user station, a mobile unit, a user equipment, a wireless unit, a remote unit, a mobile device, a wireless device, a wireless communication device, a remote device, a mobile user station, an access terminal, a mobile terminal, a wireless terminal, a remote terminal, a handheld terminal, a user agent, a mobile client, a client, or other suitable term.

The term "based on" used in the present specification do not mean "only based on" unless it is explicitly stated. In other words, the "based on" has two meanings: "only based on" and "based at least on".

Any reference to elements using terms like "first" and "second" used in the present specification does not fully restrict quantity or order of these elements. These terms can be used in the present specification as a convenient method to distinguish between two or more elements. Therefore, references to first and second elements do not mean that only two elements can be used, or that the first element should be prior to the second element in any manner.

When terms such as "include," "comprise" and variations of these are used in this specification or in claims, these terms are intended to be inclusive, like the term "provide". Furthermore, the term "or" used in the context of the present specification or claims does not mean exclusive or.

Now, although the present invention has been described in detail above, it should be obvious to a person skilled in the art that the present invention is by no means limited to the embodiments described herein. The present invention can be implemented with various corrections and in various modifications, without departing from the spirit and scope of the present invention defined by the recitations of claims. Consequently, the description herein is provided only for the purpose of explaining examples, and should by no means be construed to limit the present invention in any way.

The invention claimed is:

1. A terminal comprising:
a processor configured to:
generate, based on a second index set that is a subset of a first index set, a sequence having a same number of bits as a number of indexes included in the second index set, the first index set being ordered in ascending order of reliability, and
encode the sequence having the same number of bits as the number of indexes included in the second index set and applies the encoded sequence to a set of information bits; and
a transmitter configured to transmit the encoded set of information bits.

2. The terminal according to claim 1, wherein 0 (zero) or encoded bits are input into the sequence having the same number of bits as the number of indexes included in the second index set.

3. The terminal according to claim 1, wherein the transmitter is further configured to transmit the encoded set of information bits on a physical channel.

4. A radio communication method for terminal comprising:
generating, based on a second index set that is a subset of a first index set, a sequence having a same number of bits as a number of indexes included in the second index set, the first index set being ordered in ascending order of reliability;

encoding the sequence having the same number of bits as the number of indexes included in the second index set;

applying the encoded sequence to a set of information bits; and transmitting the encoded set of information bits.

5. A base station comprising:
- a processor configured to:
  - generate, based on a second index set that is a subset of a first index set, a sequence having a same number of bits as a number of indexes included in the second index set, the first index set being ordered in ascending order of reliability, and
  - encode the sequence having the same number of bits as the number of indexes included in the second index set and applies the encoded sequence to a set of information bits; and
- a transmitter configured to transmit the encoded set of information bits.

6. A system comprising a terminal and a base station, wherein:
- the terminal comprises:
  - a processor configured to:
    - generate, based on a second index set that is a subset of a first index set, a sequence having a same number of bits as a number of indexes included in the second index set, the first index set being ordered in ascending order of reliability, and
    - encode the sequence having the same number of bits as the number of indexes included in the second index set and applies the encoded sequence to a set of information bits; and
  - a transmitter configured to transmit the encoded set of information bits, and
- the base station comprises:
  - a receiver configured to receive the encoded set of information bits.

\* \* \* \* \*